(12) United States Patent
Lung

(10) Patent No.: US 8,497,705 B2
(45) Date of Patent: Jul. 30, 2013

(54) PHASE CHANGE DEVICE FOR INTERCONNECTION OF PROGRAMMABLE LOGIC DEVICE

(75) Inventor: Hsiang-Lan Lung, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 12/942,462

(22) Filed: Nov. 9, 2010

(65) Prior Publication Data

US 2012/0112788 A1    May 10, 2012

(51) Int. Cl.
*H03K 19/094* (2006.01)

(52) U.S. Cl.
USPC ............................................. 326/44

(58) Field of Classification Search
USPC ............................................. 326/37–47, 101
See application file for complete search history.

(56) References Cited

U.S. PATENT DOCUMENTS

| | | |
|---|---|---|
| 3,271,591 A | 9/1966 | Ovshinsky |
| 3,530,441 A | 9/1970 | Ovshinsky |
| 3,846,767 A | 11/1974 | Cohen |
| 4,452,592 A | 6/1984 | Tsai |
| 4,599,705 A | 7/1986 | Holmberg et al. |
| 4,719,594 A | 1/1988 | Young et al. |
| 4,769,339 A | 9/1988 | Ishii |
| 4,876,220 A | 10/1989 | Mohsen et al. |
| 4,959,812 A | 9/1990 | Momodomi et al. |
| 5,106,775 A | 4/1992 | Kaga et al. |
| 5,166,096 A | 11/1992 | Cote et al. |
| 5,166,758 A | 11/1992 | Ovshinsky et al. |
| 5,177,567 A | 1/1993 | Klersy et al. |
| 5,332,923 A | 7/1994 | Takeuchi |
| 5,391,901 A | 2/1995 | Tanabe |
| 5,515,488 A | 5/1996 | Hoppe et al. |
| 5,534,712 A | 7/1996 | Ovshinsky et al. |
| 5,550,396 A | 8/1996 | Tsutsumi |
| 5,687,112 A | 11/1997 | Ovshinsky |
| 5,688,713 A | 11/1997 | Linliu et al. |
| 5,716,883 A | 2/1998 | Tseng |
| 5,754,472 A | 5/1998 | Sim |
| 5,789,277 A | 8/1998 | Zahorik et al. |
| 5,789,758 A | 8/1998 | Reinberg |
| 5,814,527 A | 9/1998 | Wolstenholme et al. |
| 5,831,276 A | 11/1998 | Gonzalez et al. |
| 5,837,564 A | 11/1998 | Sandhu et al. |
| 5,841,150 A | 11/1998 | Gonzalez et al. |
| 5,869,843 A | 2/1999 | Harshfield |
| 5,879,955 A | 3/1999 | Gonzalez et al. |

(Continued)

FOREIGN PATENT DOCUMENTS

WO     2004025659 A1    3/2004

OTHER PUBLICATIONS

"Magnetic Bit Boost," www.sciencenews.org, Dec. 18 & 25, 2004, p. 389, vol. 166.

(Continued)

*Primary Examiner* — Thienvu Tran
(74) *Attorney, Agent, or Firm* — Kenta Suzue; Haynes Beffel & Wolfeld LLP

(57) ABSTRACT

A programmable logic device has a configurable interconnection coupling logic blocks, where the configurable interconnection has a phase change element with an amorphous region having a variable size to determine the phase change element is open or short. This isolates the programming path from the logic path.

8 Claims, 18 Drawing Sheets

U.S. PATENT DOCUMENTS

| | | |
|---|---|---|
| 5,902,704 A | 5/1999 | Schoenborn et al. |
| 5,920,788 A | 7/1999 | Reinberg |
| 5,933,365 A | 8/1999 | Klersy et al. |
| 5,952,671 A | 9/1999 | Reinberg et al. |
| 5,958,358 A | 9/1999 | Tenne et al. |
| 5,970,336 A | 10/1999 | Wolstenholme et al. |
| 5,985,698 A | 11/1999 | Gonzalez et al. |
| 5,998,244 A | 12/1999 | Wolstenholme et al. |
| 6,011,725 A | 1/2000 | Eitan |
| 6,025,220 A | 2/2000 | Sandhu |
| 6,031,287 A | 2/2000 | Harshfield |
| 6,034,882 A | 3/2000 | Johnson et al. |
| 6,046,951 A | 4/2000 | El Hajji |
| 6,066,870 A | 5/2000 | Siek |
| 6,075,719 A | 6/2000 | Lowrey et al. |
| 6,077,674 A | 6/2000 | Schleifer et al. |
| 6,077,729 A | 6/2000 | Harshfield |
| 6,087,269 A | 7/2000 | Williams |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,147,395 A | 11/2000 | Gilgen |
| 6,150,253 A | 11/2000 | Doan et al. |
| 6,153,890 A | 11/2000 | Wolstenholme et al. |
| 6,177,317 B1 | 1/2001 | Huang et al. |
| 6,185,122 B1 | 2/2001 | Johnson et al. |
| 6,189,582 B1 | 2/2001 | Reinberg et al. |
| 6,236,059 B1 | 5/2001 | Wolstenholme et al. |
| RE37,259 E | 7/2001 | Ovshinsky |
| 6,271,090 B1 | 8/2001 | Huang et al. |
| 6,280,684 B1 | 8/2001 | Yamada et al. |
| 6,287,887 B1 | 9/2001 | Gilgen |
| 6,291,137 B1 | 9/2001 | Lyons et al. |
| 6,314,014 B1 | 11/2001 | Lowrey et al. |
| 6,316,348 B1 | 11/2001 | Fu et al. |
| 6,320,786 B1 | 11/2001 | Chang et al. |
| 6,326,307 B1 | 12/2001 | Lindley et al. |
| 6,337,266 B1 | 1/2002 | Zahorik |
| 6,339,544 B1 | 1/2002 | Chiang et al. |
| 6,351,406 B1 | 2/2002 | Johnson et al. |
| 6,372,651 B1 | 4/2002 | Yang et al. |
| 6,380,068 B2 | 4/2002 | Jeng et al. |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,429,064 B1 | 8/2002 | Wicker |
| 6,440,837 B1 | 8/2002 | Harshfield |
| 6,462,353 B1 | 10/2002 | Gilgen |
| 6,473,332 B1 | 10/2002 | Ignatiev et al. |
| 6,483,736 B2 | 11/2002 | Johnson et al. |
| 6,487,106 B1 | 11/2002 | Kozicki |
| 6,487,114 B2 | 11/2002 | Jong et al. |
| 6,501,111 B1 | 12/2002 | Lowrey |
| 6,511,867 B2 | 1/2003 | Lowrey et al. |
| 6,512,241 B1 | 1/2003 | Lai |
| 6,512,263 B1 | 1/2003 | Yuan et al. |
| 6,514,788 B2 | 2/2003 | Quinn |
| 6,514,820 B2 | 2/2003 | Ahn et al. |
| 6,521,973 B2 | 2/2003 | Sharples et al. |
| 6,534,781 B2 | 3/2003 | Dennison |
| 6,545,903 B1 | 4/2003 | Wu |
| 6,551,866 B1 | 4/2003 | Maeda |
| 6,555,860 B2 | 4/2003 | Lowrey et al. |
| 6,563,156 B2 | 5/2003 | Harshfield |
| 6,566,700 B2 | 5/2003 | Xu |
| 6,567,293 B1 | 5/2003 | Lowrey et al. |
| 6,576,546 B2 | 6/2003 | Gilbert et al. |
| 6,579,760 B1 | 6/2003 | Lung |
| 6,586,761 B2 | 7/2003 | Lowrey |
| 6,589,714 B2 | 7/2003 | Maimon et al. |
| 6,593,176 B2 | 7/2003 | Dennison |
| 6,596,589 B2 | 7/2003 | Tseng |
| 6,597,009 B2 | 7/2003 | Wicker |
| 6,605,527 B2 | 8/2003 | Dennison et al. |
| 6,605,821 B1 | 8/2003 | Lee et al. |
| 6,607,974 B2 | 8/2003 | Harshfield |
| 6,613,604 B2 | 9/2003 | Maimon et al. |
| 6,617,192 B1 | 9/2003 | Lowrey et al. |
| 6,621,095 B2 | 9/2003 | Chiang et al. |
| 6,627,530 B2 | 9/2003 | Li et al. |
| 6,639,849 B2 | 10/2003 | Takahashi et al. |
| 6,673,700 B2 | 1/2004 | Dennison et al. |
| 6,674,115 B2 | 1/2004 | Hudgens et al. |
| 6,687,307 B1 | 2/2004 | Anikhindi et al. |
| 6,744,088 B1 | 6/2004 | Dennison |
| 6,750,079 B2 | 6/2004 | Lowrey et al. |
| 6,750,101 B2 | 6/2004 | Lung |
| 6,759,267 B2 | 7/2004 | Chen |
| 6,791,102 B2 | 9/2004 | Johnson et al. |
| 6,797,979 B2 | 9/2004 | Chiang et al. |
| 6,800,504 B2 | 10/2004 | Li et al. |
| 6,800,563 B2 | 10/2004 | Xu |
| 6,677,678 B2 | 11/2004 | Chen |
| 6,815,704 B1 | 11/2004 | Chen |
| 6,838,692 B1 | 1/2005 | Lung |
| 6,850,432 B2 | 2/2005 | Lu et al. |
| 6,859,389 B2 | 2/2005 | Idehara |
| 6,861,267 B2 | 3/2005 | Xu et al. |
| 6,864,500 B2 | 3/2005 | Gilton |
| 6,864,503 B2 | 3/2005 | Lung |
| 6,867,638 B2 | 3/2005 | Saiki et al. |
| 6,881,603 B2 | 4/2005 | Lai |
| 6,888,750 B2 | 5/2005 | Walker et al. |
| 6,894,304 B2 | 5/2005 | Moore |
| 6,894,305 B2 | 5/2005 | Yi et al. |
| 6,900,517 B2 | 5/2005 | Tanaka et al. |
| 6,903,362 B2 | 6/2005 | Wyeth et al. |
| 6,909,107 B2 | 6/2005 | Rodgers et al. |
| 6,910,907 B2 | 6/2005 | Layadi et al. |
| 6,927,410 B2 | 8/2005 | Chen |
| 6,928,022 B2 | 8/2005 | Cho et al. |
| 6,933,516 B2 | 8/2005 | Xu |
| 6,936,544 B2 | 8/2005 | Huang et al. |
| 6,936,840 B2 | 8/2005 | Sun et al. |
| 6,937,507 B2 | 8/2005 | Chen |
| 6,943,365 B2 | 9/2005 | Lowrey et al. |
| 6,969,866 B1 | 11/2005 | Lowrey et al. |
| 6,972,428 B2 | 12/2005 | Maimon |
| 6,972,430 B2 | 12/2005 | Casagrande et al. |
| 6,977,181 B1 | 12/2005 | Raberg |
| 6,992,932 B2 | 1/2006 | Cohen |
| 6,998,289 B2 | 2/2006 | Hudgens et al. |
| 7,023,008 B1 | 4/2006 | Happ |
| 7,023,009 B2 | 4/2006 | Kostylev et al. |
| 7,033,856 B2 | 4/2006 | Lung |
| 7,038,230 B2 | 5/2006 | Chen et al. |
| 7,038,938 B2 | 5/2006 | Kang |
| 7,042,001 B2 | 5/2006 | Kim et al. |
| 7,054,183 B2 | 5/2006 | Rinerson et al. |
| 7,067,837 B2 | 6/2006 | Hwang et al. |
| 7,067,864 B2 | 6/2006 | Nishida et al. |
| 7,067,865 B2 | 6/2006 | Lung |
| 7,078,273 B2 | 7/2006 | Matsuoka et al. |
| 7,099,180 B1 | 8/2006 | Dodge et al. |
| 7,115,927 B2 | 10/2006 | Hideki et al. |
| 7,116,593 B2 | 10/2006 | Hanzawa et al. |
| 7,122,281 B2 | 10/2006 | Pierrat |
| 7,122,824 B2 | 10/2006 | Khouri et al. |
| 7,126,149 B2 | 10/2006 | Iwasaki et al. |
| 7,126,847 B2 | 10/2006 | Ha et al. |
| 7,132,675 B2 | 11/2006 | Gilton |
| 7,151,273 B2 | 12/2006 | Campbell et al. |
| 7,154,774 B2 | 12/2006 | Bedeschi et al. |
| 7,158,411 B2 | 1/2007 | Yeh et al. |
| 7,164,147 B2 | 1/2007 | Lee et al. |
| 7,166,533 B2 | 1/2007 | Happ |
| 7,169,635 B2 | 1/2007 | Kozicki |
| 7,202,493 B2 | 4/2007 | Lung |
| 7,208,751 B2 | 4/2007 | Ooishi |
| 7,214,958 B2 | 5/2007 | Happ |
| 7,220,983 B2 | 5/2007 | Lung |
| 7,229,883 B2 | 6/2007 | Wang et al. |
| 7,238,959 B2 | 7/2007 | Chen |
| 7,238,994 B2 | 7/2007 | Chen et al. |

| Patent No. | Date | Inventor |
|---|---|---|
| 7,248,494 B2 | 7/2007 | Oh et al. |
| 7,251,157 B2 | 7/2007 | Osada et al. |
| 7,253,429 B2 | 8/2007 | Klersy et al. |
| 7,254,059 B2 | 8/2007 | Li et al. |
| 7,262,502 B2 | 8/2007 | Chang |
| 7,269,052 B2 | 9/2007 | Segal et al. |
| 7,277,317 B2 | 10/2007 | Le Phan |
| 7,291,556 B2 | 11/2007 | Choi et al. |
| 7,307,451 B2 | 12/2007 | Pellizzer et al. |
| 7,309,630 B2 | 12/2007 | Fan et al. |
| 7,314,776 B2 | 1/2008 | Johnson et al. |
| 7,317,201 B2 | 1/2008 | Gutsche et al. |
| 7,319,608 B2 | 1/2008 | Hsu et al. |
| 7,321,130 B2 | 1/2008 | Lung et al. |
| 7,323,708 B2 | 1/2008 | Lee et al. |
| 7,323,734 B2 | 1/2008 | Ha et al. |
| 7,332,370 B2 | 2/2008 | Chang et al. |
| 7,336,526 B2 | 2/2008 | Osada et al. |
| 7,351,648 B2 | 4/2008 | Furukawa et al. |
| 7,359,231 B2 | 4/2008 | Venkataraman et al. |
| 7,364,935 B2 | 4/2008 | Lung |
| 7,365,385 B2 | 4/2008 | Abbott |
| 7,379,328 B2 | 5/2008 | Osada et al. |
| 7,385,235 B2 | 6/2008 | Lung |
| 7,388,273 B2 | 6/2008 | Burr et al. |
| 7,394,088 B2 | 7/2008 | Lung |
| 7,397,060 B2 | 7/2008 | Lung |
| 7,400,522 B2 | 7/2008 | Toda et al. |
| 7,423,300 B2 | 9/2008 | Lung et al. |
| 7,426,134 B2 | 9/2008 | Happ et al. |
| 7,427,531 B2 | 9/2008 | Cho et al. |
| 7,440,308 B2 | 10/2008 | Jeong et al. |
| 7,449,710 B2 | 11/2008 | Lung |
| 7,473,576 B2 | 1/2009 | Lung |
| 7,479,649 B2 | 1/2009 | Lung |
| 7,483,292 B2 | 1/2009 | Lung |
| 7,485,891 B2 | 2/2009 | Hamann et al. |
| 7,488,968 B2 | 2/2009 | Lee |
| 7,502,252 B2 | 3/2009 | Fuji et al. |
| 7,507,986 B2 | 3/2009 | Lung et al. |
| 7,514,334 B2 | 4/2009 | Chen et al. |
| 7,514,705 B2 | 4/2009 | Breitwisch et al. |
| 7,515,461 B2 | 4/2009 | Happ et al. |
| 7,551,473 B2 | 6/2009 | Lung et al. |
| 7,569,844 B2 | 8/2009 | Lung |
| 7,623,370 B2 | 11/2009 | Toda et al. |
| 7,651,906 B2 | 1/2010 | Park et al. |
| 7,683,360 B2 | 3/2010 | Chen et al. |
| 7,688,619 B2 | 3/2010 | Lung et al. |
| 7,696,503 B2 | 4/2010 | Lung et al. |
| 7,701,759 B2 | 4/2010 | Lung et al. |
| 7,778,079 B2 * | 8/2010 | Jeong et al. ............... 365/185.14 |
| 7,868,313 B2 | 1/2011 | Breitwisch et al. |
| 2002/0017701 A1 | 2/2002 | Klersy et al. |
| 2002/0070457 A1 | 6/2002 | Sun et al. |
| 2002/0113273 A1 | 8/2002 | Hwang et al. |
| 2002/0168852 A1 | 11/2002 | Harshfield et al. |
| 2003/0072195 A1 | 4/2003 | Mikolajick |
| 2003/0095426 A1 | 5/2003 | Hush et al. |
| 2003/0116794 A1 | 6/2003 | Lowrey |
| 2003/0186481 A1 | 10/2003 | Lung |
| 2003/0211732 A1 | 11/2003 | Chiang |
| 2004/0026686 A1 | 2/2004 | Lung |
| 2004/0051094 A1 | 3/2004 | Ooishi |
| 2004/0113137 A1 | 6/2004 | Lowrey |
| 2004/0165422 A1 | 8/2004 | Hideki et al. |
| 2004/0248339 A1 | 12/2004 | Lung |
| 2004/0256610 A1 | 12/2004 | Lung |
| 2005/0018526 A1 | 1/2005 | Lee |
| 2005/0029502 A1 | 2/2005 | Hudgens |
| 2005/0029587 A1 | 2/2005 | Harshfield |
| 2005/0045919 A1 | 3/2005 | Kaeriyama et al. |
| 2005/0052904 A1 | 3/2005 | Cho et al. |
| 2005/0062087 A1 | 3/2005 | Chen et al. |
| 2005/0093022 A1 | 5/2005 | Lung |
| 2005/0127349 A1 | 6/2005 | Horak et al. |
| 2005/0141261 A1 | 6/2005 | Ahn |
| 2005/0145984 A1 | 7/2005 | Chen et al. |
| 2005/0167656 A1 | 8/2005 | Sun et al. |
| 2005/0191804 A1 | 9/2005 | Lai et al. |
| 2005/0195633 A1 | 9/2005 | Choi et al. |
| 2005/0201182 A1 | 9/2005 | Osada et al. |
| 2005/0212024 A1 | 9/2005 | Happ |
| 2005/0212026 A1 | 9/2005 | Chung et al. |
| 2005/0215009 A1 | 9/2005 | Cho |
| 2005/0263829 A1 | 12/2005 | Song et al. |
| 2005/0270832 A1 | 12/2005 | Chu et al. |
| 2006/0006472 A1 | 1/2006 | Jiang |
| 2006/0018156 A1 | 1/2006 | Happ |
| 2006/0038221 A1 | 2/2006 | Lee et al. |
| 2006/0066156 A1 | 3/2006 | Dong et al. |
| 2006/0073642 A1 | 4/2006 | Yeh et al. |
| 2006/0091476 A1 | 5/2006 | Pinnow et al. |
| 2006/0094154 A1 | 5/2006 | Lung |
| 2006/0097775 A1 * | 5/2006 | Zhu et al. ..................... 327/544 |
| 2006/0108667 A1 | 5/2006 | Lung |
| 2006/0110878 A1 | 5/2006 | Lung et al. |
| 2006/0110888 A1 | 5/2006 | Cho et al. |
| 2006/0113520 A1 | 6/2006 | Yamamoto et al. |
| 2006/0113521 A1 | 6/2006 | Lung |
| 2006/0118913 A1 | 6/2006 | Yi et al. |
| 2006/0124916 A1 | 6/2006 | Lung |
| 2006/0126395 A1 | 6/2006 | Chen et al. |
| 2006/0131555 A1 | 6/2006 | Liu et al. |
| 2006/0138467 A1 | 6/2006 | Lung |
| 2006/0154185 A1 | 7/2006 | Ho et al. |
| 2006/0157680 A1 | 7/2006 | Takaura et al. |
| 2006/0157681 A1 | 7/2006 | Chen et al. |
| 2006/0163554 A1 | 7/2006 | Lankhorst et al. |
| 2006/0169968 A1 | 8/2006 | Happ |
| 2006/0171194 A1 | 8/2006 | Lowrey et al. |
| 2006/0172067 A1 | 8/2006 | Ovshinsky et al. |
| 2006/0175599 A1 | 8/2006 | Happ |
| 2006/0186483 A1 | 8/2006 | Cho et al. |
| 2006/0192193 A1 | 8/2006 | Lee et al. |
| 2006/0198183 A1 | 9/2006 | Kawahara et al. |
| 2006/0202245 A1 | 9/2006 | Zuliani et al. |
| 2006/0205108 A1 | 9/2006 | Maimon et al. |
| 2006/0211165 A1 | 9/2006 | Hwang et al. |
| 2006/0226409 A1 | 10/2006 | Burr et al. |
| 2006/0234138 A1 | 10/2006 | Fehlhaber et al. |
| 2006/0237756 A1 | 10/2006 | Park et al. |
| 2006/0245236 A1 | 11/2006 | Zaidi |
| 2006/0250885 A1 | 11/2006 | Cho et al. |
| 2006/0261392 A1 | 11/2006 | Lee et al. |
| 2006/0266993 A1 | 11/2006 | Suh et al. |
| 2006/0284157 A1 | 12/2006 | Chen et al. |
| 2006/0284158 A1 | 12/2006 | Lung et al. |
| 2006/0284214 A1 | 12/2006 | Chen |
| 2006/0284279 A1 | 12/2006 | Lung et al. |
| 2006/0286709 A1 | 12/2006 | Lung et al. |
| 2006/0286743 A1 | 12/2006 | Lung et al. |
| 2006/0289847 A1 | 12/2006 | Dodge |
| 2006/0289848 A1 | 12/2006 | Dennison |
| 2007/0007613 A1 | 1/2007 | Wang et al. |
| 2007/0008786 A1 | 1/2007 | Scheuerlein |
| 2007/0030721 A1 | 2/2007 | Segal et al. |
| 2007/0037101 A1 | 2/2007 | Morioka |
| 2007/0040159 A1 | 2/2007 | Wang |
| 2007/0051936 A1 | 3/2007 | Pellizzer et al. |
| 2007/0096071 A1 | 5/2007 | Kordus et al. |
| 2007/0096162 A1 | 5/2007 | Happ et al. |
| 2007/0096248 A1 | 5/2007 | Philipp et al. |
| 2007/0108077 A1 | 5/2007 | Lung et al. |
| 2007/0108429 A1 | 5/2007 | Lung |
| 2007/0108430 A1 | 5/2007 | Lung |
| 2007/0108431 A1 | 5/2007 | Chen et al. |
| 2007/0109836 A1 | 5/2007 | Lung |
| 2007/0109843 A1 | 5/2007 | Lung et al. |
| 2007/0111429 A1 | 5/2007 | Lung |
| 2007/0115794 A1 | 5/2007 | Lung |
| 2007/0117315 A1 | 5/2007 | Lai et al. |
| 2007/0120104 A1 | 5/2007 | Ahn et al. |
| 2007/0121363 A1 | 5/2007 | Lung |
| 2007/0121374 A1 | 5/2007 | Lung et al. |
| 2007/0126040 A1 | 6/2007 | Lung |
| 2007/0131922 A1 | 6/2007 | Lung |
| 2007/0138458 A1 | 6/2007 | Lung |

| | | |
|---|---|---|
| 2007/0146012 A1 | 6/2007 | Murphy et al. |
| 2007/0147105 A1 | 6/2007 | Lung et al. |
| 2007/0153563 A1 | 7/2007 | Nirschl |
| 2007/0154847 A1 | 7/2007 | Chen et al. |
| 2007/0155172 A1 | 7/2007 | Lai et al. |
| 2007/0156949 A1 | 7/2007 | Rudelic et al. |
| 2007/0158632 A1 | 7/2007 | Ho |
| 2007/0158633 A1 | 7/2007 | Lai et al. |
| 2007/0158645 A1 | 7/2007 | Lung |
| 2007/0158690 A1 | 7/2007 | Ho et al. |
| 2007/0158862 A1 | 7/2007 | Lung |
| 2007/0161186 A1 | 7/2007 | Ho |
| 2007/0170881 A1 | 7/2007 | Noh et al. |
| 2007/0173019 A1 | 7/2007 | Ho et al. |
| 2007/0173063 A1 | 7/2007 | Lung |
| 2007/0176261 A1 | 8/2007 | Lung |
| 2007/0187664 A1 | 8/2007 | Happ |
| 2007/0201267 A1 | 8/2007 | Happ et al. |
| 2007/0215852 A1 | 9/2007 | Lung |
| 2007/0224726 A1 | 9/2007 | Chen et al. |
| 2007/0235707 A1* | 10/2007 | Kordus et al. ............ 257/2 |
| 2007/0235811 A1 | 10/2007 | Furukawa et al. |
| 2007/0236989 A1 | 10/2007 | Lung |
| 2007/0246699 A1 | 10/2007 | Lung |
| 2007/0249090 A1 | 10/2007 | Philipp et al. |
| 2007/0252127 A1 | 11/2007 | Arnold et al. |
| 2007/0257300 A1 | 11/2007 | Ho et al. |
| 2007/0262388 A1 | 11/2007 | Ho et al. |
| 2007/0267618 A1 | 11/2007 | Zaidi et al. |
| 2007/0274121 A1 | 11/2007 | Lung et al. |
| 2007/0285960 A1 | 12/2007 | Lung et al. |
| 2007/0298535 A1 | 12/2007 | Lung |
| 2008/0006811 A1 | 1/2008 | Philipp et al. |
| 2008/0012000 A1 | 1/2008 | Harshfield |
| 2008/0014676 A1 | 1/2008 | Lung et al. |
| 2008/0025089 A1 | 1/2008 | Scheuerlein et al. |
| 2008/0043520 A1 | 2/2008 | Chen |
| 2008/0094871 A1 | 4/2008 | Parkinson |
| 2008/0101110 A1 | 5/2008 | Happ et al. |
| 2008/0106923 A1 | 5/2008 | Lung |
| 2008/0137400 A1 | 6/2008 | Chen et al. |
| 2008/0137402 A1* | 6/2008 | Cho et al. ............ 365/163 |
| 2008/0138929 A1 | 6/2008 | Lung |
| 2008/0138930 A1 | 6/2008 | Lung |
| 2008/0138931 A1 | 6/2008 | Lung |
| 2008/0164453 A1 | 7/2008 | Breitwisch et al. |
| 2008/0165569 A1 | 7/2008 | Chen et al. |
| 2008/0165570 A1 | 7/2008 | Happ et al. |
| 2008/0165572 A1 | 7/2008 | Lung |
| 2008/0166875 A1 | 7/2008 | Lung |
| 2008/0179582 A1 | 7/2008 | Burr et al. |
| 2008/0180990 A1 | 7/2008 | Lung |
| 2008/0186755 A1 | 8/2008 | Lung et al. |
| 2008/0191187 A1 | 8/2008 | Lung et al. |
| 2008/0192534 A1 | 8/2008 | Lung |
| 2008/0197334 A1 | 8/2008 | Lung |
| 2008/0224119 A1 | 9/2008 | Burr et al. |
| 2008/0225489 A1 | 9/2008 | Cai et al. |
| 2008/0265234 A1 | 10/2008 | Lung et al. |
| 2008/0280401 A1 | 11/2008 | Burr et al. |
| 2008/0303014 A1 | 12/2008 | Goux et al. |
| 2008/0310208 A1 | 12/2008 | Daley |
| 2009/0001341 A1 | 1/2009 | Breitwisch et al. |
| 2009/0014704 A1 | 1/2009 | Chen et al. |
| 2009/0023242 A1 | 1/2009 | Lung |
| 2009/0027950 A1 | 1/2009 | Lam et al. |
| 2009/0042335 A1 | 2/2009 | Lung |
| 2009/0057641 A1 | 3/2009 | Lung |
| 2009/0072215 A1 | 3/2009 | Lung et al. |
| 2009/0098678 A1 | 4/2009 | Lung |
| 2009/0166600 A1 | 7/2009 | Park et al. |
| 2009/0166603 A1 | 7/2009 | Lung |
| 2009/0268507 A1 | 10/2009 | Breitwisch et al. |
| 2009/0289242 A1 | 11/2009 | Breitwisch et al. |
| 2009/0294748 A1 | 12/2009 | Breitwisch et al. |
| 2010/0055830 A1 | 3/2010 | Chen et al. |
| 2010/0084624 A1 | 4/2010 | Lung et al. |
| 2010/0144128 A1 | 6/2010 | Lung et al. |
| 2010/0151652 A1 | 6/2010 | Lung et al. |
| 2010/0157665 A1 | 6/2010 | Lung et al. |
| 2010/0193763 A1 | 8/2010 | Chen et al. |
| 2010/0270529 A1 | 10/2010 | Lung |
| 2010/0291747 A1 | 11/2010 | Lung et al. |
| 2010/0328995 A1 | 12/2010 | Shih et al. |
| 2010/0328996 A1 | 12/2010 | Shih et al. |
| 2011/0013446 A1 | 1/2011 | Lung |
| 2011/0034003 A1 | 2/2011 | Lung |
| 2011/0049456 A1 | 3/2011 | Lung et al. |

OTHER PUBLICATIONS

"New Memories Tap Spin, Gird for Battle," Science News, Apr. 3, 1999, p. 223, vol. 155.

"Optimized Thermal Capacitance in a Phase Change Memory Cell Design," IPCOM000141986D, IP.com Prior Art Database, Oct. 18, 2006, 4pp.

"Remembering on the Cheap," www.sciencenews.org, Mar. 19, 2005, p. 189, vol. 167.

"Thermal Conductivity of Crystalline Dielectrics" in CRC Handbook of Chemistry and Physics, Internet Version 2007, (87th edition), David R. Lide, ed. Taylor and Francis, Boca Raton, Fl, 2pp.

Adler, D. et al., "Threshold Switching in Chalcogenide-Glass Thin Films," J. Appl/Phys 51(6), Jun. 1980, pp. 3289-3309.

Adler, David, "Amorphous-Semiconductor Devices," Sci. Amer., vol. 236, pp. 36-48, May 1977.

Ahn, S. J. et al., "A Highly Manufacturable High Density Phase Change Memory of 64 Mb and Beyond," IEEE IEDM Dec. 13-15, 2004, pp. 907-910.

Ahn, S. J. et al., "Highly Reliable 5nm Contact Cell Technology for 256Mb PRAM," VLSI Technology, Digest of Technical Papers, Jun. 14-16, 2005, pp. 98-99.

Atwood, G, et al., "90 nm Phase Change Technology with u Trench and Lance Cell Elements," VLSI Technology, Systems and Applications, Apr. 23-25, 2007, pp. 1-2.

Axon Technologies Corporation paper: Technology Description, published at least as early as Dec. 1997, pp. 1-6.

Bedeschi, F. et al., "4-MB MOSFET-Selected Phase-Change Memory Experimental Chip," IEEE, Sep. 21 to 23, 2004, 4 PP.

Blake thesis, "Investigation of GeTeSb5 Chalcogenide Films for Use as an Analog Memory," AFIT/GE/ENG/00M-04, Mar. 2000, 121 pages.

Chao, Der-Sheng, et al., "Low Programming Current Phase Change Memory Cell with Double GST Thermally Confined Structure," Int'l Symp on VLSI Technology, Systems and Applications, Apr. 23-25, 2007, pp. 1-2.

Chen, An et al., "Non-Volatile Resistive Switching for Advanced Memory Applications," IEEE IEDM, Dec. 5-7, 2005, 4 pp.

Cho, S. L. et al., "Highly Scalable On-axis Confined Cell Structure for High Density PRAM beyond 256Mb," Jun. 14-16, 2005 Symposium on VLSI Technology Digest of Technical Papers, pp. 96-97.

Gibson, G. A. et al., "Phase-change Recording Medium that Enables Ultrahigh-density Electron-beam Data Storage," Applied Physics Letter, 2005, 3 pp., vol. 86.

Gill, Manzur et al., "A High-Performance Nonvolatile Memory Technology for Stand-Alone Memory and Embedded Applications," Feb. 3-7, 2002 IEEE-ISSCC Technical Digest (TD 12.4), 7 pp.

Gleixner, "Phase Change Memory Reliability", 22nd NVSMW, Aug. 26, 2007, 46 pages.

Ha, Y. H. et al., "An Edge Contact Type Cell for Phase Change RAM Featuring Very Low Power Consumption," Jun. 10-12, 2003 Symposium on VLSI Technology Digest of Technical Papers, pp. 175-176.

Hanzawa, Satoru, et al., "A 512kB Embedded Phase Change Memory with 416kB/s Write Throughput at 100mA Cell Write Current," ISSCC 2007, Session 26, Non-Volatile Memories/26.2, 3 pages.

Happ, T. D. et al., "Novel None-Mask Self-Heating Pillar Phase Change Memory," 2006 Symposium on VLSI Technology, 2 pp.

Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4pp.

Horii, H. et al., "A Novel Cell Technology Using N-doped GeSbTe Films for Phase Change RAM," Jun. 10-12, 2003 Symposium on VLSI Technology Digest of Technical Papers, pp. 177-178.

Hudgens, S. et al., "Overview of Phase-Change Chalcogenide Nonvolatile Memory Technology," MRS Bulletin, Nov. 2004, pp. 829-832.

Hwang, Y. N. et al., "Full Integration and Reliability Evaluation of Phase-change RAM Based on 0.24um-CMOS Technologies," Jun. 10-12, 2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA 2004, pp. 28-29 and workshop cover sheet.

Kim, Kinam et al., "Reliability Investigations for Manufacturable High Density PRAM," IEEE 43rd Annual International Reliability Physics Symposium, San Jose, Apr. 17-21, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L., "Electrothermal and Phase-change Dynamics in Chalcogenide-based Memories," IEEE IEDM Dec. 13-15, 2004, 4 pp.

Lai, Stefan, "Current Status of the Phase Change Memory and Its Future," IEEE IEDM Dec. 10, 2003, pp. 255-258.

Lai, Stephan et al., "OUM-A 180 nm Nonvolatile Memory Cell Element Technology for Stand Alone and Embedded Applications," IEEE IEDM Dec. 2-5, 2001, pp. 803-806.

Lankhorst, Martijn H.R., et al; Low-Cost and Nanoscale Non-Volatile Memory Concept for Future Silicon Chips, Mar. 13, 2005, 6 pp., Nature Materials Advance Online Publication, www.nature.com/naturematerials.

Li, Yiming, "Temperature dependence on the contact size of GeSbTe films for phase change memories," J. Comput Electron (2008) 7:138-141.

Mott, Nevill, "Electrons in Glass," Nobel Lecture, Dec. 8, 1977, Physics, 1977, pp. 403-413.

Oh, Hyung-Rok, et al., "Enhanced Write Performance of a 64Mb Phase-Change Random Access Memory," ISSCC 2005, Session 2, Non-Volatile Memory, 2.3, 3 pages.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al.,"Novel u Trench Phase-Change Memory Cell for Embedded and Stand-Alone Non-Volatile Memory Applications," Jun. 15-17, 2004 Symposium on VLSI Technology Digest of Technical Papers, pp. 18-19.

Pirovano, Agostino et al.,"Reliability Study of Phase-Change Nonvolatile Memories," IEEE Transactions on Device and Materials Reliability, Sep. 2004, pp. 422-427, vol. 4, No. 3.

Prakash, S. et al., "A guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcogenide Materials," IEEE Electron Device Letters, Oct. 2004, pp. 684-686, vol. 25, No. 10.

Rochefort, C. et al., "Manufacturing of High Aspect-Ration p-n Junctions Using Vapor Phase Doping for Application in Multi-Resurf Devices," IEEE Jun. 4-7, 2002, pp. 237-240.

Schafft, Harry A. et al., "Thermal Conductivity Measurements of Thin Films Silicon Dioxide," Proceedings of the IEEE 1989 International Conference on Microelectronic Test Structures vol. 2, No. 1, Mar. 1989, pp. 121-124.

Strauss, Karl F. et al., "Overview of Radiation Tolerant Unlimited Write Cycle Non-Volatile Memory," IEEE Mar. 18-25, 2000, pp. 399-408.

Subramanian, Vivek et al., "Low Leakage Germanium-Seeded Laterally-Crystallized Single-Grain 100-nm TFT's for Vertical Integration Applications," IEEE Electron Device Letters, vol. 20, No. 7, Jul. 1999, pp. 341-343.

Wicker, Guy et al., Nonvolatile, High Density, High Performance Phase Change Memory, 1999, http://klabs.org/richcontent/MAPLDCon99/Papers/P21_Tyson_P.PDF#search='nonvolatile%20high%20density%20high%20performance%20phase%20change%20memory', 8pages.

Wicker, Guy, "A Comprehensive Model of Submicron Chalcogenide Switching Devices," Doctoral Dissertation, Wayne State University, Detroit, MI 1996, 137 pp.

Wolf, Stanley, Excerpt from: Silicon Processing for the VLSI Era—vol. 4, pp. 674-679, 2004.

Wuttig, Matthias, "Towards a Universal Memory?" Nature Materials, Apr. 2005, pp. 265-266, vol. 4.

Yamada, Noboru, "Potential of Ge-Sb-Te phase-change optical disks for high-data-rate recording in the near future," (Conference Proceedings Paper), Jul. 30, 1997, vol. 3109, 10 pages.

Yi, J. H. et al., "Novel Cell Structure of PRAM with Thin Metal Layer Inserted GeSbTe," IEEE IEDM Dec. 10, 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

\* cited by examiner

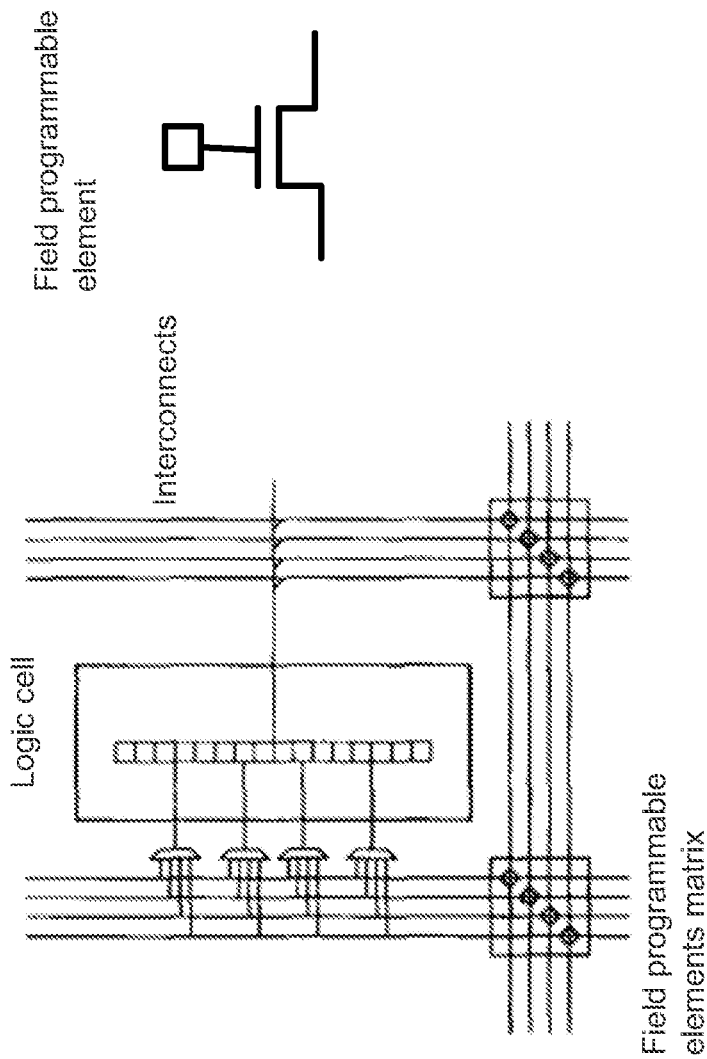
Fig. 2
Fig. 3
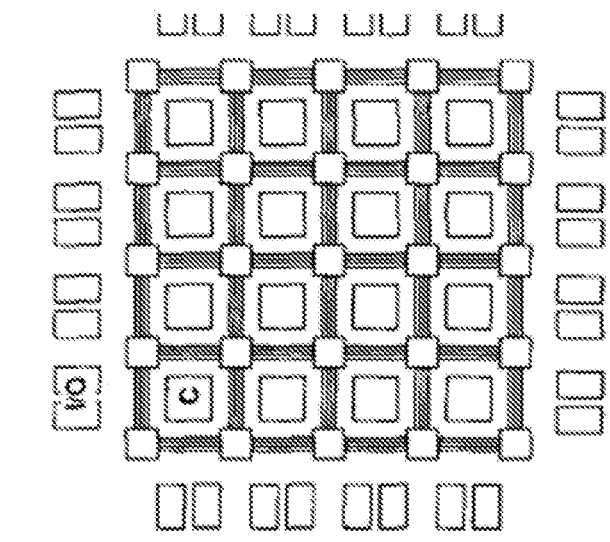
Fig. 1

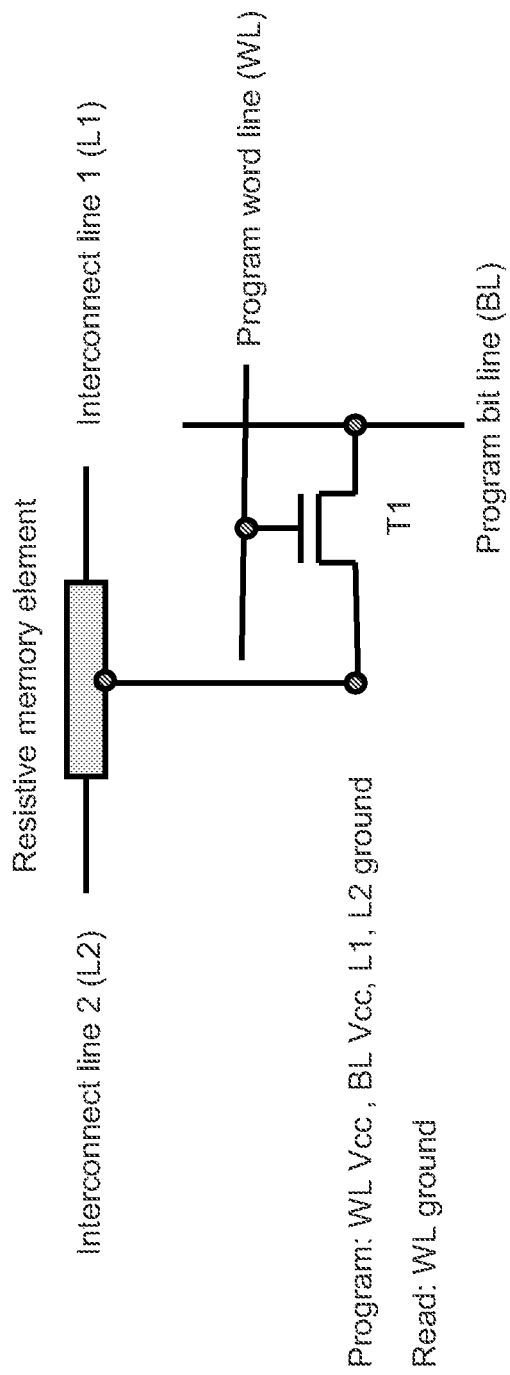

PHASE CHANGE DEVICE FOR INTERCONNECTION OF PROGRAMMABLE LOGIC DEVICE

BACKGROUND

1. Field of the Invention

This technology relates to a configurable interconnection coupling interconnects, and a programmable logic device with such configurable interconnections.

2. Description of Related Art

In the field programmable gate array (FPGA) device described by U.S. Pat. Nos. 7,307,451 and 7,511,523; and U.S. Patent Application Publication No. 2007/0146012, a phase change material storage element is part of a control unit that stores settings of the configurable interconnections of the FPGA. The control unit is distinct from the actual configurable interconnections of the FPGA. Every time the FPGA is turned on, the contents of the control unit are read, and used to determine the settings of the configurable interconnections of the FPGA.

In the programmable matrix of an FPGA device described by U.S. Pat. No. 7,499,315 and U.S. Patent Application Publication No. 2006/0171194, a phase change material storage element is again part of a control cell, distinct from the actual configurable interconnections of the FPGA. Also discussed is the use of anti-fuse devices that directly connect a vertical interconnect and a horizontal interconnect. Such anti-fuse devices are programmed via signals through the very same vertical interconnect and horizontal interconnect that are coupled by the anti-fuse device. Because programming circuitry for the anti-fuse devices is connected to the same interconnects for logical operations, the interconnects have an additional RC delay associated with the programming circuitry load.

SUMMARY

One aspect of the technology is an apparatus includes a programmable logic device having logic blocks, configurable interconnections coupling interconnects of the logic blocks, and programming circuitry of the configurable interconnections. The configurable interconnections include phase change elements. Each phase change element is coupling a first interconnect and a second interconnect of the logic blocks. Each phase change element includes an amorphous region. The amorphous region is connected to a heater to receive pulses from the programming circuitry. The amorphous region electrically isolates the heater from the first interconnect and the second interconnect. The pulses are received from the programming circuitry via a path distinct from the first interconnect and the second interconnect of the logic blocks.

In some embodiments, the amorphous region electrically isolates the first interconnect and the second interconnect of the logic blocks from the programming circuitry. When the phase change element receives pulses from the programming circuitry via the amorphous region, because the amorphous region is a high resistance region, the remaining non-amorphous region (e.g., crystalline region) of the phase change element is electrically isolated from the programming circuitry. Similarly, the interconnects of the logic blocks that are electrically connected to the non-amorphous region (e.g., crystalline region) of the phase change element are electrically isolated from the programming circuitry. Because of the electrical isolation of the interconnects of the logic blocks from the programming circuitry, the interconnects of the logic blocks are free of the RC delay which would otherwise result from the programming circuitry load.

In some embodiments, each phase change element has multiple electrical resistance states. A first state has low electrical resistance between the first interconnect and the second interconnect, responsive to the amorphous region having a first size. A second state has a second electrical resistance between the first interconnect and the second interconnect. Responsive to the amorphous region having a second size larger than the first size, the second electrical resistance is higher than the first electrical resistance.

In some embodiments, the programming circuitry is configured to apply the pulses, including pulses of different electrical characteristics. For example, a first reset pulse and a second reset pulse of different electrical characteristics result in a variable size of the amorphous region. In one embodiment, the first reset pulse and the second reset pulse have a same duration. An example of the same duration for the first reset pulse and the second reset pulse is a value in the range between 1-50 nanoseconds. In another embodiment, the first reset pulse and the second reset pulse have different voltages. In yet another embodiment, the first reset pulse and the second reset pulse have a same duration but different voltages.

Some embodiments include grounding transistors electrically coupled to the interconnects of the logic blocks. The grounding transistors electrically isolate the interconnects from the programming circuitry. For example, a programming bit line turns on the grounding transistor to electrically ground the interconnects during programming of the configurable interconnections.

Some embodiments include the heater connected to the amorphous region and in the path receiving pulses from the programming circuitry.

Another aspect of the technology is an apparatus including a switch coupling a first node and a second node, as described herein.

One aspect of the technology is an apparatus including a programmable logic device having logic blocks, configurable interconnections coupling interconnects of the logic blocks, and programming circuitry of the configurable interconnections. The programming circuitry has program word lines and program bit lines. The configurable interconnections each include a resistive memory element, and a first transistor and a second transistor of opposite conductivity types, such as a p-type field effect transistor and an n-type field effect transistor.

The resistive memory element has different states to selectably electrically couple a first interconnect and a second interconnect of the logic blocks, such that depending on the state of the resistive memory element, the first interconnect and a second interconnect of the logic blocks are electrically coupled or decoupled. The resistive memory element includes a first end electrically coupled to the first interconnect of the logic blocks, and a second end electrically coupled to a first current carrying terminal of both the first transistor and the second transistor. For example, the second end of the resistive memory element is electrically coupled to a source/drain terminal of a p-type field effect transistor and a source/drain terminal of an n-type field effect transistor.

The first transistor has a control terminal, the first current carrying terminal, and a second current carrying terminal electrically coupled to the second interconnect of the logic blocks. As previously stated, the first current carrying terminal is electrically coupled to the second end of the resistive memory element. For example, the first transistor is a p-type field effect transistor with a gate terminal, the source/drain terminal electrically coupled to the second end of the resistive memory element, and a drain/source terminal electrically coupled to the second interconnect of the logic blocks.

The second transistor having a control terminal, the first current carrying terminal, and a second current carrying terminal electrically coupled to a program bit line of the programming circuitry. As previously stated, the first current carrying terminal is electrically coupled to the second end of the resistive memory element. For example, the second transistor is an n-type field effect transistor with a gate terminal, the source/drain terminal electrically coupled to the second end of the resistive memory element, and a drain/source terminal electrically coupled to a program bit line of the programming circuitry.

The control terminals of both the first transistor and the second transistor are electrically coupled to a same program word line of the programming circuitry. For example, the gates of both the p-type field effect transistor and the n-type field effect transistor are electrically coupled to a same program word line of the programming circuitry.

In some embodiments, during operation of the logic blocks, the programmable logic device includes control circuitry that applies a voltage to the same program word line to turn on the first transistor and turn off the second transistor. For example, a low or ground voltage applied to the same program word line turns on the p-type transistor and turns off the n-type transistor. During operation of the logic blocks, the second transistor (e.g., the n-type transistor), in its off state, isolates the program bit line (on one side of the second transistor) from the resistive memory element, the first interconnect, and the second interconnect (on the other side of the second transistor).

In some embodiments, during programming of the resistive memory element, the programmable logic device includes control circuitry that applies a voltage to the same program word line to turn off the first transistor and turn on the second transistor. For example, a high voltage applied to the same program word line turns off the p-type transistor and turns on the n-type transistor. During programming of the resistive memory element, the first transistor (e.g., the p-type transistor) isolates the second interconnect (on one side of the first transistor) from the resistive memory element and the program bit line (on the other side of the first transistor).

Accordingly, in many embodiments, during normal operation of the configurable interconnections including programming of the resistive memory element and operation of the logic blocks, either only the first transistor is on, or only the second transistor is on.

Another aspect of the technology is an apparatus including a configurable interconnection including a resistive memory element, and a first transistor and a second transistor of opposite conductivity types, as described herein.

BRIEF DESCRIPTION OF THE DRAWINGS

FIG. 1 shows a simplified block diagram of an FPGA.

FIG. 2 shows a larger view of an exemplary portion of the simplified block diagram of an FPGA of FIG. 1, showing a logic block/cell, interconnects of the logic block/cell connecting to the logic block/cell and leading around the logic block/cell, and a matrix of configurable interconnections coupling these interconnects.

FIG. 3 shows a larger view of an exemplary portion of the matrix of configurable interconnections of FIG. 1, showing one configurable interconnection of the matrix.

FIG. 6 shows an example circuit of a resistive memory element as the configurable interconnection coupling interconnects 1 and 2 of the logic blocks, where the resistive memory element is programmed through a field effect transistor connected to a program word line and a program bit line.

DETAILED DESCRIPTION

Programmable logic devices (PLDs) are a type of integrated circuit that can be programmed to perform specified logic functions. PLDs include programmable logic array (PLA) devices, programmable array logic (PAL) devices, erasable programmable logic devices (EPLD), and programmable gate arrays (PGA).

One type of PLD, the field programmable gate array (FPGA), typically includes programmable logic blocks, configurable interconnections, and input/output blocks. In one implementation on an integrated circuit, the input/output blocks are fabricated on the perimeter of the die surrounding the logic blocks. The logic blocks perform logic functions of various complexity. Examples of the logic blocks are random access memory blocks, multipliers, digital signal processing blocks, processors, clock managers, delay lock loops, blocks of Boolean logic and/or state machine logic of various complexity, and the like. By programming the configurable interconnections coupling the logic blocks, the programmed logic functions of individual configurable logic blocks can be coupled together to implement more complex and customized logic functions.

FIG. 1 shows a simplified block diagram of an FPGA.

FIG. 2 shows a larger view of an exemplary portion of the simplified block diagram of an FPGA of FIG. 1, showing a logic block/cell, interconnects of the logic block/cell connecting to the logic block/cell and leading around the logic block/cell, and a matrix of configurable interconnections coupling these interconnects.

FIG. 3 shows a larger view of an exemplary portion of the matrix of configurable interconnections of FIG. 1, showing one configurable interconnection of the matrix.

Figure 4:
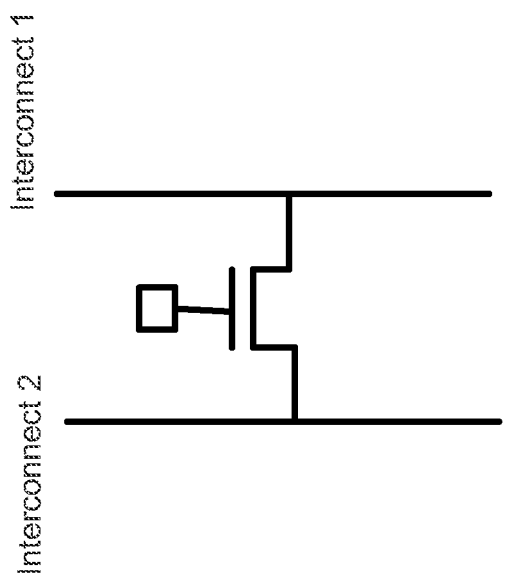
FIG. 4 shows the configurable interconnection of FIG. 3, which is configurable to electrically couple or decouple interconnects 1 and 2 of the logic blocks of an FPGA.

FIG. 4 shows the configurable interconnection of FIG. 3, which is configurable to electrically couple or decouple interconnects 1 and 2 of the logic blocks of an FPGA.

Figure 5:
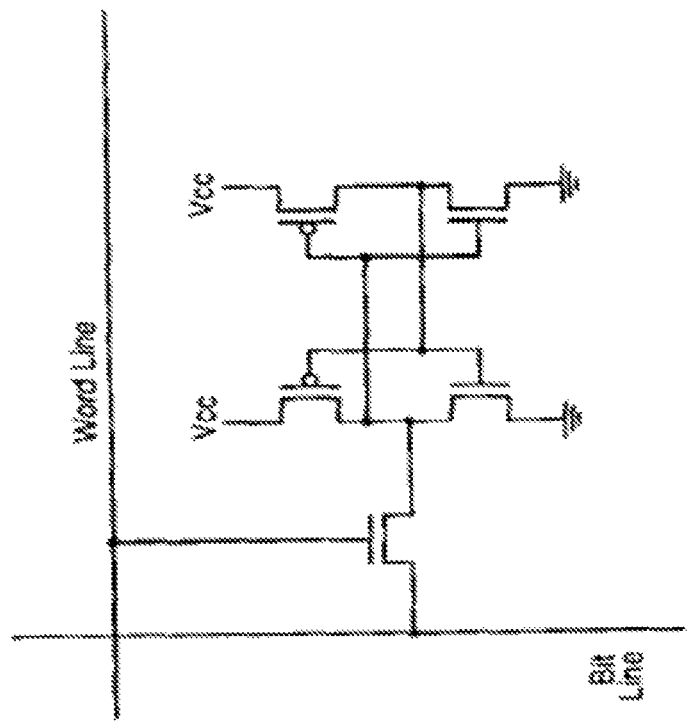
FIG. 5 shows an example SRAM which stores the configuration information that is used to configure the configurable interconnection of FIG. 4.

FIG. 5 shows an example SRAM which stores the configuration information that is used to configure the configurable interconnection of FIG. 4.

FIG. 6 shows an example circuit of a resistive memory element as the configurable interconnection coupling interconnects 1 and 2 of the logic blocks, where the resistive memory element is programmed through a field effect transistor connected to a program word line and a program bit line.

Different bias conditions are shown. To program the resistive memory element, both the programming word line and the programming bit line have Vcc, and both the interconnects 1 and 2 are grounded. To read the resistive memory element, the programming word line is grounded.

Figure 7:
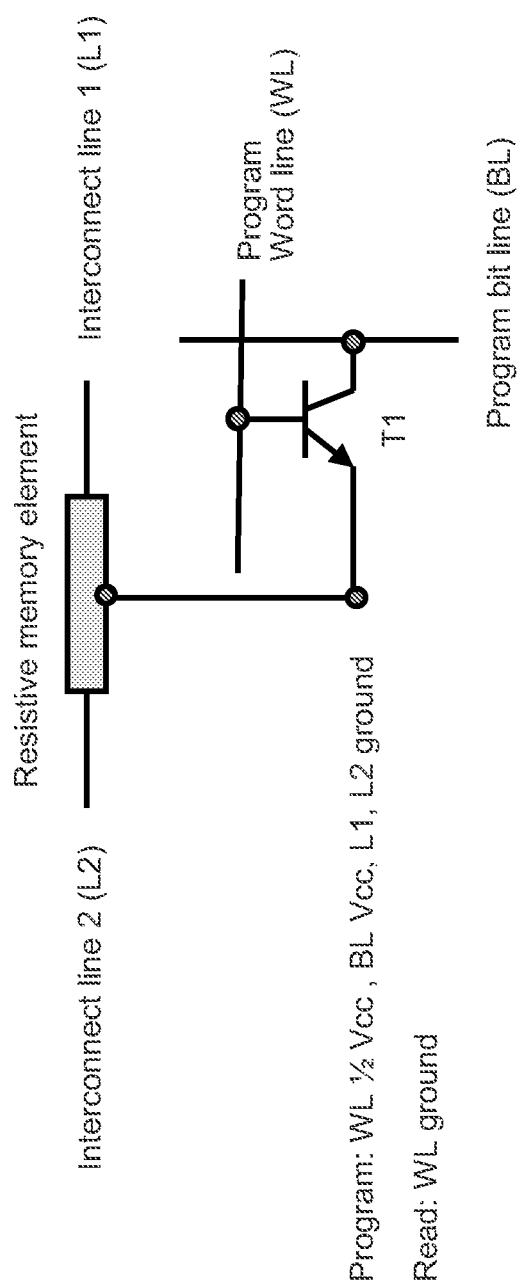
FIG. 7 shows an example circuit of a resistive memory element as the configurable interconnection coupling interconnects 1 and 2 of the logic blocks, where the resistive memory element is programmed through a bipolar junction transistor connected to a program word line and a program bit line.

FIG. 7 shows an example circuit of a resistive memory element as the configurable interconnection coupling interconnects 1 and 2 of the logic blocks, where the resistive memory element is programmed through a bipolar junction transistor connected to a program word line and a program bit line.

Different bias conditions are shown. To program the resistive memory element, the programming word line has one half Vcc, the programming bit line has Vcc, and both the interconnects 1 and 2 are grounded. To read the resistive memory element, the programming word line is grounded.

Figure 8:
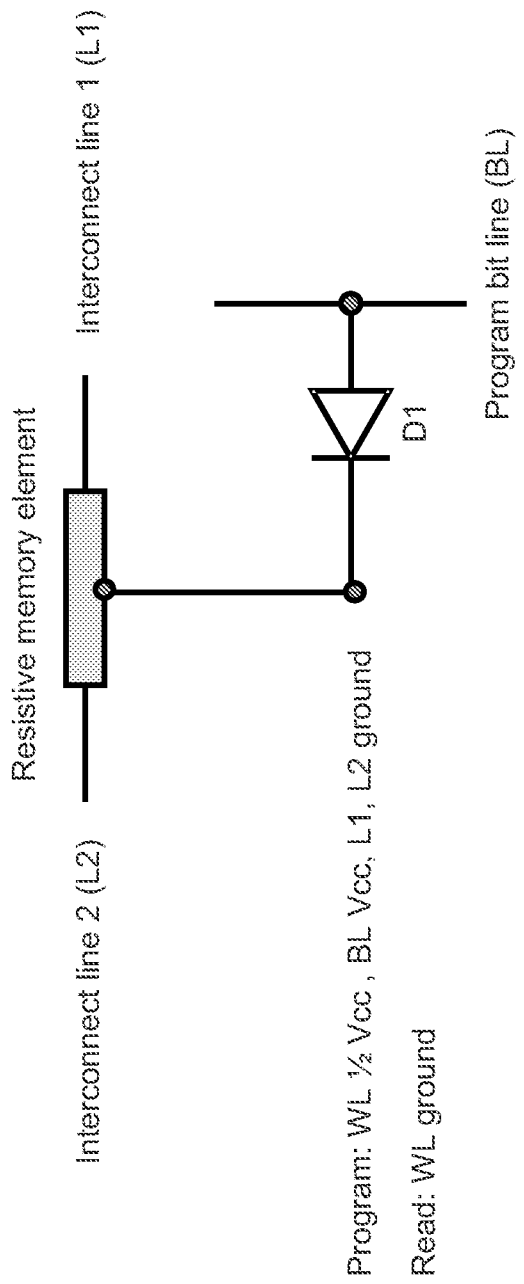
FIG. 8 shows an example circuit of a resistive memory element as the configurable interconnection coupling interconnects 1 and 2 of the logic blocks, where the resistive memory element is programmed through a diode connected to a program bit line.

FIG. 8 shows an example circuit of a resistive memory element as the configurable interconnection coupling interconnects 1 and 2 of the logic blocks, where the resistive memory element is programmed through a diode connected to a program bit line.

Different bias conditions are shown. To program the resistive memory element, the programming word line has one half Vcc, the programming bit line has Vcc, and both the interconnects 1 and 2 are grounded. To read the resistive memory element, the programming word line is grounded.

Figure 9:
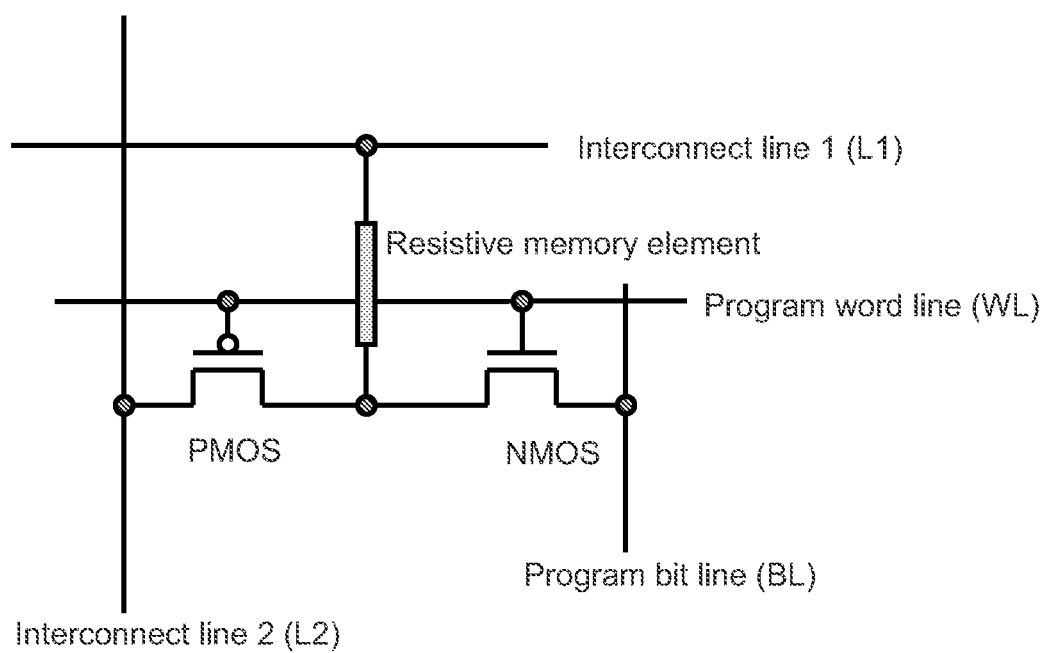
FIG. 9 shows an example circuit of a resistive memory element and field effect transistors as the configurable interconnection selectively coupling interconnects 1 and 2 of the logic blocks, and selectively coupling a program bit line with interconnect 1 of the logic blocks.

FIG. 9 shows an example circuit of a resistive memory element and field effect transistors as the configurable interconnection selectively coupling interconnects 1 and 2 of the logic blocks, and selectively coupling a program bit line with interconnect 1 of the logic blocks.

Between interconnect line 2 and a programming bit line, a p-type FET and an n-type FET are connected in series. The interconnect line 2 is on the p-type FET side and the programming bit line is on the n-type FET side. The gates of both the p-type FET and the n-type FET are connected to a programming word line. A programmable resistive memory element has one end connected between the p-type FET and the n-type FET, and the other end connected to interconnect line 1. Examples of the n-type FET and p-type FET are NMOS and PMOS transistors. In another embodiment, the positions of the n-type and p-type FETs are exchanged, and the logic of the programming word line is altered to exchange logically high and logically low values.

During programming, the programming word line, and programming bit line have Vdd. Interconnect 1 is grounded. The result is that the NMOS turns on, and the PMOS turns off. Interconnect 2 is isolated from the programming circuitry path and interconnect 1.

During logic operations, the programming word line, and the programming bit line are grounded. The result is that the NMOS turns off, and the PMOS turns on. The logic path of the interconnects is isolated from the programming circuitry by the NMOS.

The following discusses memory operations of a phase change memory cell generally. Reading or writing to a phase change memory cell embodiment of a resistive memory element can be achieved by applying an appropriate voltage to the corresponding word line and an appropriate voltage or current to the corresponding bit line to induce a current through the memory element. The level and duration of the voltages/currents applied is dependent upon the operation performed, e.g. a reading operation or a writing operation.

In a reset (erase) operation of the phase change memory cell, a reset pulse applied to the word line and the bit line induces a current through the memory element to cause a transition of an active region of the memory element into an amorphous phase, thereby setting the phase change material to a resistance within a resistance value range associated with the reset state. The reset pulse is a relatively high energy pulse, sufficient to raise the temperature of at least the active region of the memory element above the transition (crystallization) temperature of the phase change material and also above the melting temperature to place at least the active region in a liquid state. The reset pulse is then quickly terminated, resulting in a relatively quick quenching time as the active region quickly cools to below the transition temperature so that the active region stabilizes to a generally amorphous phase.

In a set (or program) operation of phase change memory cell, a program pulse is applied to the word line and the bit line of suitable amplitude and duration to induce a current through the memory element sufficient to raise the temperature of at least a portion of the active region of the memory element above the transition temperature and cause a transition of at least a portion of the active region from the amorphous phase into a crystalline phase, this transition lowering the resistance of the memory element and setting the memory cell to the desired state.

In a read (or sense) operation of the data value stored in the memory cell, a read pulse applied to the corresponding word line and the corresponding bit line of suitable amplitude and duration to induce current to flow through the memory element that does not result in the memory element undergoing a change in resistive state. The current through the memory cell is dependent upon the resistance of the memory element and thus the data value stored in the memory cell. The data valued stored in the memory cell may be determined, for example, by comparison of the current on bit line with a suitable reference current by sense amplifiers. Alternatively, the data value stored in the memory cell may be determined, for example, using source side sensing by comparison of the current on the conductive material of the memory plane with a suitable reference current.

In various embodiments, a configurable interconnection includes a resistive memory element. Programmable resistance memory materials include materials that use different crystal phase changes to determine resistance, or memory materials that use an electrical pulse to change the resistance state. Examples include materials for use in resistance random access memory (RRAM) such as metal-oxides including tungsten-oxide ($WO_x$), NiO, $Nb_2O_5$, $CuO_2$, $Ta_2O_5$, $Al_2O_3$, CoO, $Fe_2O_3$, $HfO_2$, $TiO_2$, $SrTiO_3$, $SrZrO_3$, $(BaSr)TiO_3$. Additional examples include materials for use in magnetoresistance random access memory (MRAM) such as spin-torque-transfer (STT) MRAM, for example at least one of CoFeB, Fe, Co, Ni, Gd, Dy, CoFe, NiFe, MnAs, MnBi, MnSb, $CrO_2$, $MnOFe_2O_3$, $FeOFe_2O_5$, $NiOFe_2O_3$, $MgOFe_2$, EuO, and $Y_3Fe_5O_{12}$. See, for example, US Publication No 2007/0176251 entitled "Magnetic Memory Device and Method of Fabricating the Same," which is incorporated by reference herein. Additional examples include solid electrolyte materials used for programmable-metallization-cell (PMC) memory, or nano-ionic memory, such as silver-doped germanium sulfide electrolytes and copper-doped germanium sulfide electrolytes. See, for example, N. E. Gilbert et al., "A macro model of programmable metallization cell devices," Solid-State Electronics 49 (2005) 1813-1819, which is incorporated by reference herein.

Embodiments of the programmable resistance material of the memory elements include phase-change-based memory materials, including chalcogenide based materials and other materials. Chalcogens include any of the four elements oxygen (O), sulfur (S), selenium (Se), and tellurium (Te), forming part of group VIA of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from group IVA of the periodic table of elements, such as germanium (Ge) and tin (Sn). Often, chalcogenide alloys include combinations including one or more of antimony (Sb), gallium (Ga), indium (In), and silver (Ag). Many phase-change-based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb_{100-(a+b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky U.S. Pat. No. 5,687,112, cols. 10-11.) Particular alloys evaluated by another researcher include $Ge_2Sb_2Te_5$, $GeSb_2Te_4$ and $GeSb_4Te_7$ (Noboru Yamada, "Potential of Ge—Sb—Te Phase-Change Optical Disks for High-Data-Rate Recording", SPIE v.3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistance properties. Specific examples of memory materials that may be useful are given in Ovshinsky '112 at columns 11-13, which examples are hereby incorporated by reference.

Chalcogenides and other phase change materials are doped with impurities in some embodiments to modify conductivity, transition temperature, melting temperature, and other properties of memory elements using the doped chalcogenides. Representative impurities used for doping chalcogenides include nitrogen, silicon, oxygen, silicon dioxide, silicon nitride, copper, silver, gold, aluminum, aluminum oxide, tantalum, tantalum oxide, tantalum nitride, titanium and titanium oxide. See, e.g., U.S. Pat. No. 6,800,504, and U.S. Patent Application Publication No. U.S. 2005/0029502.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. In following sections of the disclosure, the phase change material is referred to as GST, and it will be understood that other types of phase change materials can be used. A material useful for implementation of a PCRAM described herein is $Ge_2Sb_2Te_5$.

An exemplary method for forming chalcogenide material uses PVD-sputtering or magnetron-sputtering method with source gas(es) of Ar, $N_2$, and/or He, etc. at the pressure of 1 mTorr~100 mTorr. The deposition is usually done at room temperature. A collimator with an aspect ratio of 1~5 can be used to improve the fill-in performance. To improve the fill-in performance, a DC bias of several tens of volts to several hundreds of volts is also used. Also, a combination of DC bias and a collimator can be used.

An exemplary method for forming chalcogenide material uses chemical vapor deposition CVD such as that disclosed in US Publication No 2006/0172067 entitled "Chemical Vapor Deposition of Chalcogenide Materials," which is incorporated by reference herein.

A post-deposition annealing treatment in a vacuum or in an $N_2$ ambient is optionally performed to improve the crystallize state of chalcogenide material. The annealing temperature typically ranges from 100° C. to 400° C. with an anneal time of less than 30 minutes.

The embodiments shown in FIGS. 10-16 feature multiple similar reset pulses of a relatively high energy and short duration to result in different states of (i) shorted state or state of low resistance and (ii) open state or state of high resistance. The pulses have a magnitude ranging from 1V-5V in magnitude and 1 ns to 100 ns in duration. Regardless of the particular state following a particular reset pulse, applying a set pulse readies resistive memory element for a subsequent application of one of the multiple similar reset pulses.

This is different from many other applications, which rely on very different reset and set pulses to result in different states, in particular (i) a reset pulse of a relatively high energy and short duration to result in an open state or state of high resistance, and (ii) a set pulse of a relatively low energy and long duration to result in a shorted state or state of low resistance.

Figure 10:
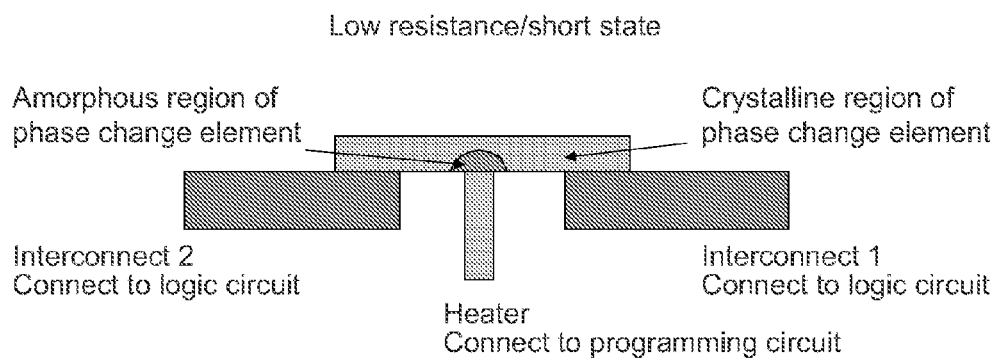
FIG. 10 shows an example arrangement of a phase change element as the configurable interconnection coupling interconnects 1 and 2 of the logic blocks, where the phase change element has an amorphous region through which the phase change element receives pulses from a programming circuit, and the configurable interconnection is in a shorted state, or state of low resistance, due to the small size of the amorphous region.

FIG. 10 shows an example arrangement of a phase change element as the configurable interconnection coupling interconnects 1 and 2 of the logic blocks, where the phase change element has an amorphous region through which the phase change element receives pulses from a programming circuit, and the configurable interconnection is in a shorted state, or state of low resistance, due to the small size of the amorphous region.

Figure 11:
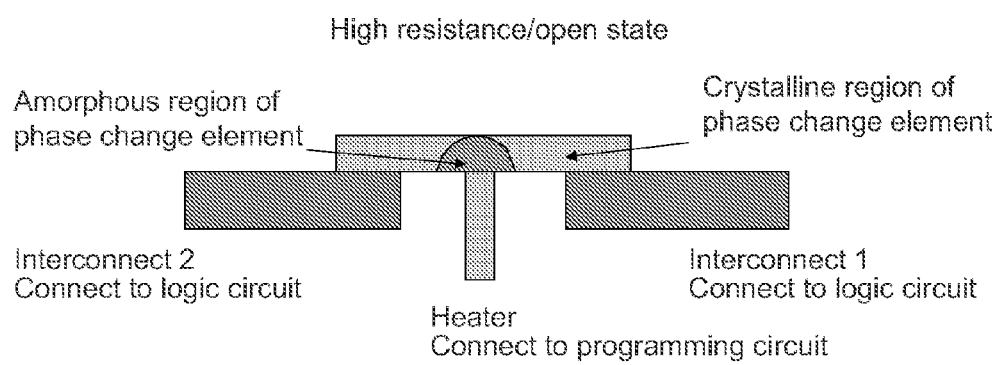
FIG. 11 shows an example arrangement of a phase change element as the configurable interconnection coupling interconnects 1 and 2 of the logic blocks, where the phase change element has an amorphous region through which the phase change element receives pulses from a programming circuit, and the configurable interconnection is in an open state, or state of high resistance, due to the large size of the amorphous region.

FIG. 11 shows an example arrangement of a phase change element as the configurable interconnection coupling interconnects 1 and 2 of the logic blocks, where the phase change element has an amorphous region through which the phase change element receives pulses from a programming circuit, and the configurable interconnection is in an open state, or state of high resistance, due to the large size of the amorphous region.

Figure 12:
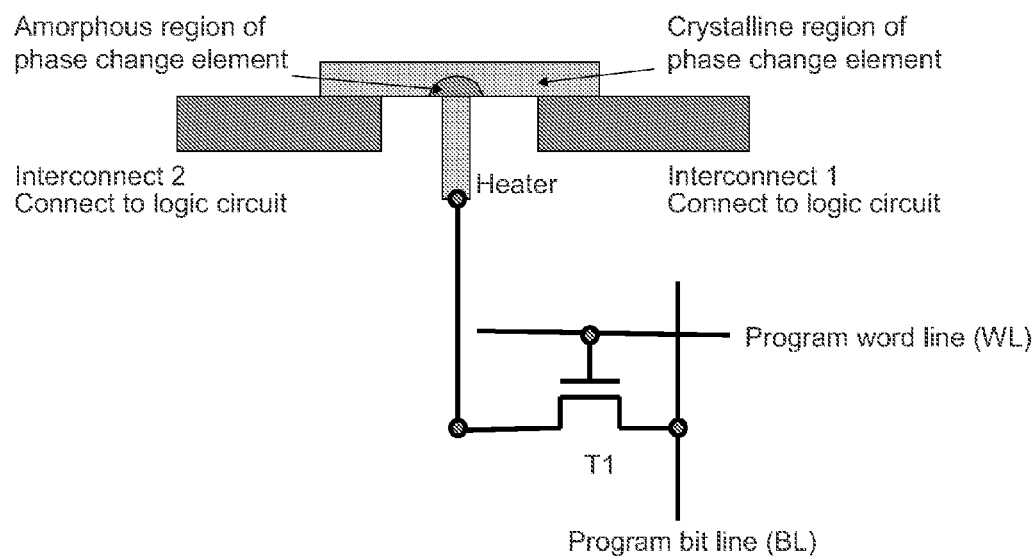
FIG. 12 shows an example arrangement of a phase change element as the configurable interconnection coupling interconnects 1 and 2 of the logic blocks, where the phase change element has an amorphous region through which the phase change element receives pulses from a programming circuit, and the phase change element is programmed through a field effect transistor connected to a program word line and a program bit line.

FIG. 12 shows an example arrangement of a phase change element as the configurable interconnection coupling interconnects 1 and 2 of the logic blocks, where the phase change element has an amorphous region through which the phase change element receives pulses from a programming circuit, and the phase change element is programmed through a field effect transistor connected to a program word line and a program bit line.

Figure 13:
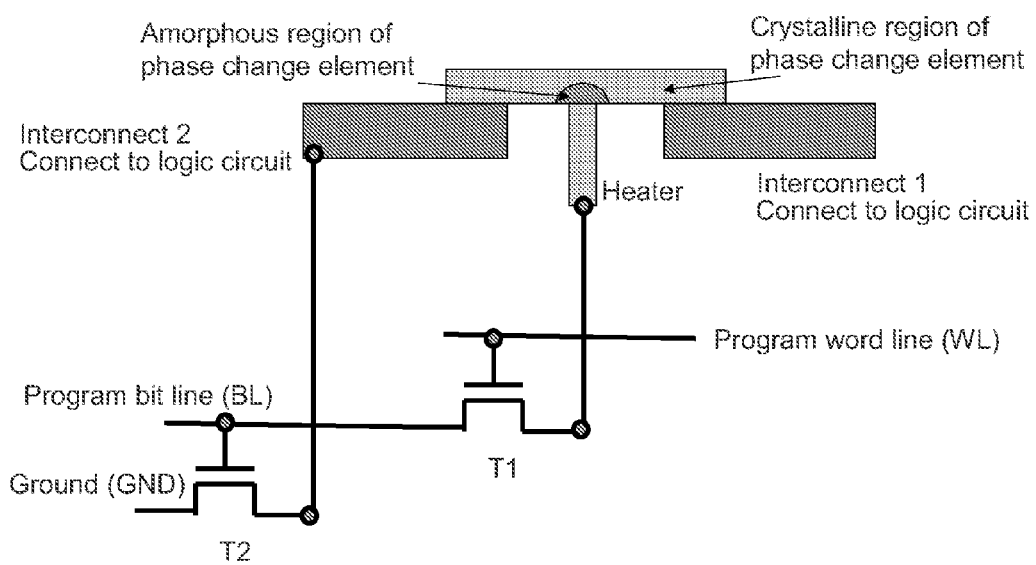
FIG. 13 shows an example arrangement of a phase change element as the configurable interconnection coupling interconnects 1 and 2 of the logic blocks, where the phase change element has an amorphous region through which the phase change element receives pulses from a programming circuit, the phase change element is programmed through a field effect transistor connected to a program word line and a program bit line, and interconnect 2 of the logic blocks is grounded through a field effect transistor connected to a program bit line.

FIG. 13 shows an example arrangement of a phase change element as the configurable interconnection coupling interconnects 1 and 2 of the logic blocks, where the phase change element has an amorphous region through which the phase change element receives pulses from a programming circuit, the phase change element is programmed through a field effect transistor connected to a program word line and a program bit line, and interconnect 2 of the logic blocks is grounded through a field effect transistor connected to a program bit line.

Figure 14:
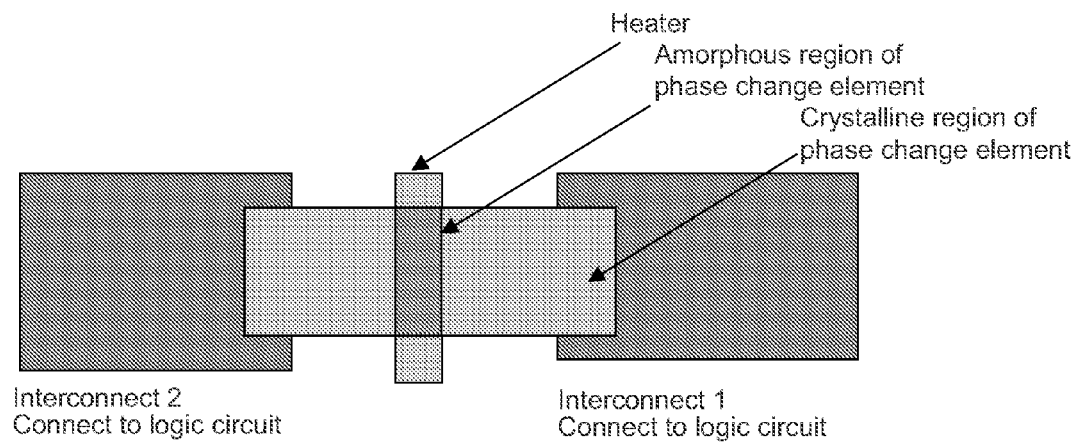
FIG. 14 is a top view of an example arrangement of a phase change element as the configurable interconnection coupling interconnects 1 and 2 of the logic blocks, where the phase change element has an amorphous region through which the phase change element receives pulses from a programming circuit.

FIG. 14 is a top view of an example arrangement of a phase change element as the configurable interconnection coupling interconnects 1 and 2 of the logic blocks, where the phase change element has an amorphous region through which the phase change element receives pulses from a programming circuit.

Figure 15:
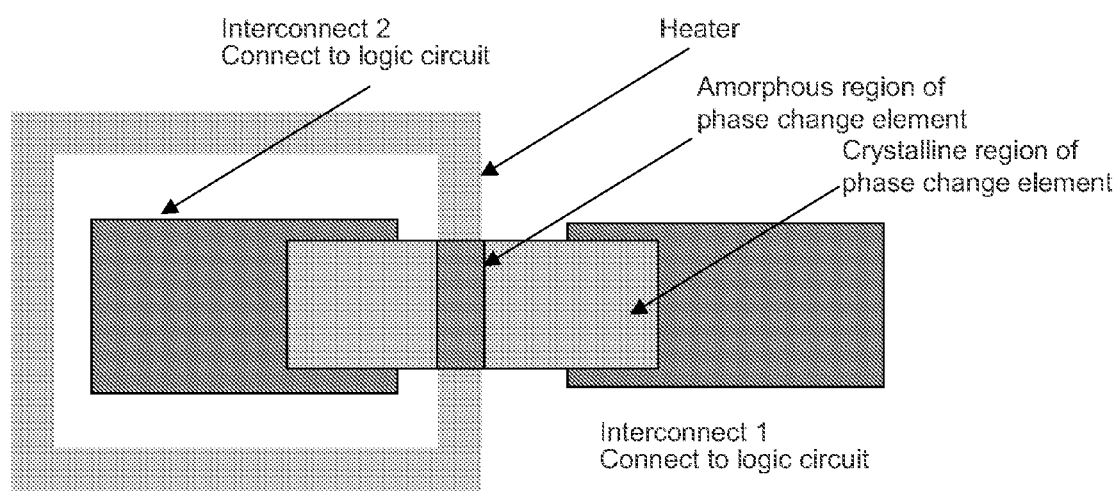
FIG. 15 is a top view of an example arrangement of a phase change element as the configurable interconnection coupling interconnects 1 and 2 of the logic blocks, where the phase change element has an amorphous region through which the phase change element receives pulses from a programming circuit, and the heater connected to the amorphous region surrounds interconnect 2 of the logic blocks.

FIG. 15 is a top view of an example arrangement of a phase change element as the configurable interconnection coupling interconnects 1 and 2 of the logic blocks, where the phase change element has an amorphous region through which the phase change element receives pulses from a programming circuit, and the heater connected to the amorphous region surrounds interconnect 2 of the logic blocks. This embodiment saves one mask step.

Figure 16:
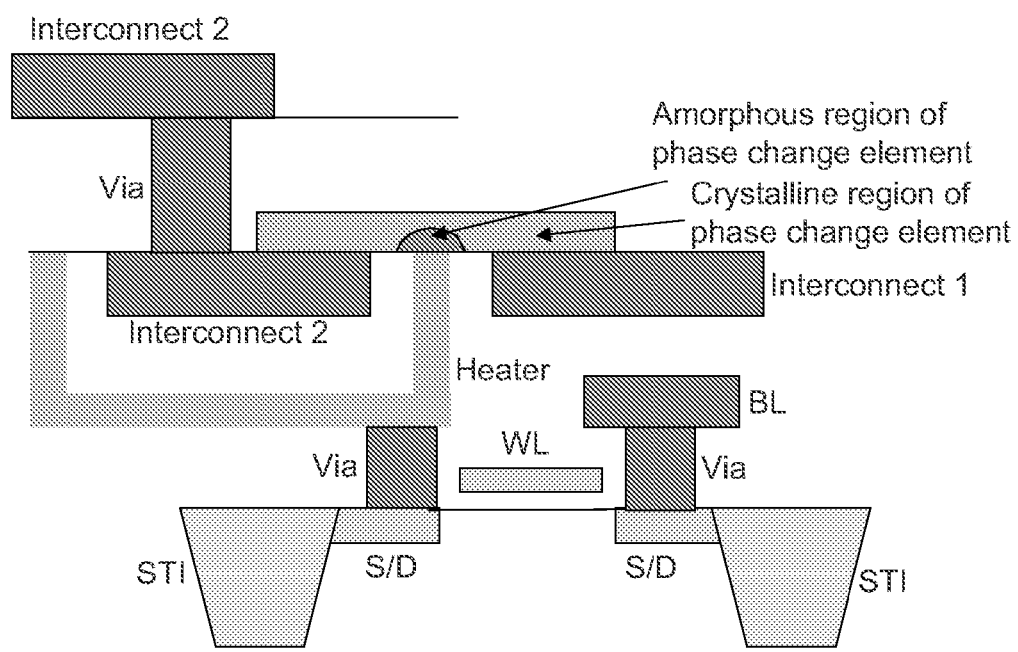
FIG. 16 is a side view of an example arrangement of a phase change element as the configurable interconnection coupling interconnects 1 and 2 of the logic blocks, where the phase change element has an amorphous region through which the phase change element receives pulses from a programming circuit, and the heater connected to the amorphous region surrounds interconnect 2 of the logic blocks.

FIG. 16 is a side view of an example arrangement of a phase change element as the configurable interconnection coupling interconnects 1 and 2 of the logic blocks, where the phase change element has an amorphous region through which the phase change element receives pulses from a programming circuit, and the heater connected to the amorphous region surrounds interconnect 2 of the logic blocks.

A programming path includes the programming bit line BL which connects, through a via, to the transistor source/drain S/D. The other transistor source/drain S/D connects, through another via, to a heater. The heater surrounds interconnect 2 and connects to the amorphous region of a phase change element. The phase change element physically connects interconnect 1 and interconnect 2. Interconnect 2 is on multiple levels, connected by a via.

FIGS. 17-23 show side views of a process flow to make a phase change element as the configurable interconnection coupling interconnects 1 and 2 of the logic blocks, where the phase change element has an amorphous region through which the phase change element receives pulses from a programming circuit.

Figure 17:
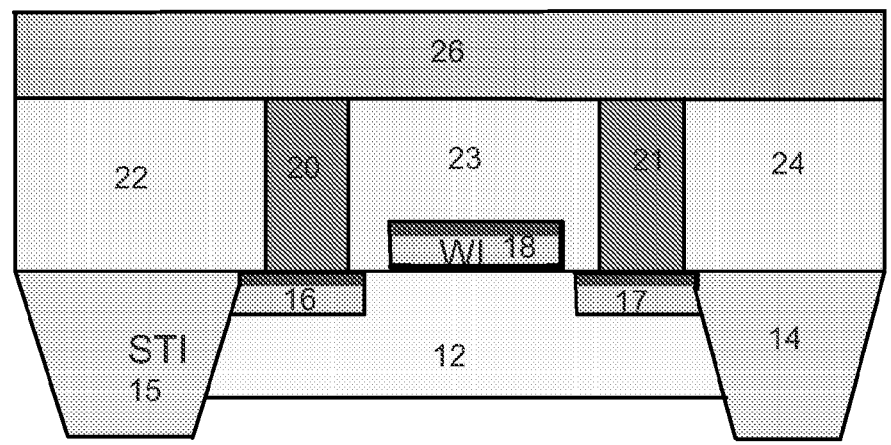
FIGS. 17-23 show side views of a process flow to make a phase change element as the configurable interconnection coupling interconnects 1 and 2 of the logic blocks, where the phase change element has an amorphous region through which the phase change element receives pulses from a programming circuit.

In FIG. 17, shallow trench isolation (STI) structures 14 and 15 electrically isolate the field effect transistor in between, from neighboring electrical devices. Substrate material (alternatively a doped n-well or p-well) 12 is positioned between the STI structures 14 and 15. The field effect transistor includes a portion of the material 12 as the body, source and drain regions 16 and 17, and a programming word line 18 as the gate. In representative embodiments, the word line material can be a doped polysilicon, or other conductive material such as titanium nitride or other conductive nitride, tungsten, or other metal. Also, combinations of such materials can be used. Conductive via 20 and bit line 21 electrically connect to the source and drain regions 16 and 17. Dielectric fill material 22, 23, and 24 surround the conductive vias 20 and 21. Heater and interconnect material layer 26 is formed to cover the structure.

Figure 18:
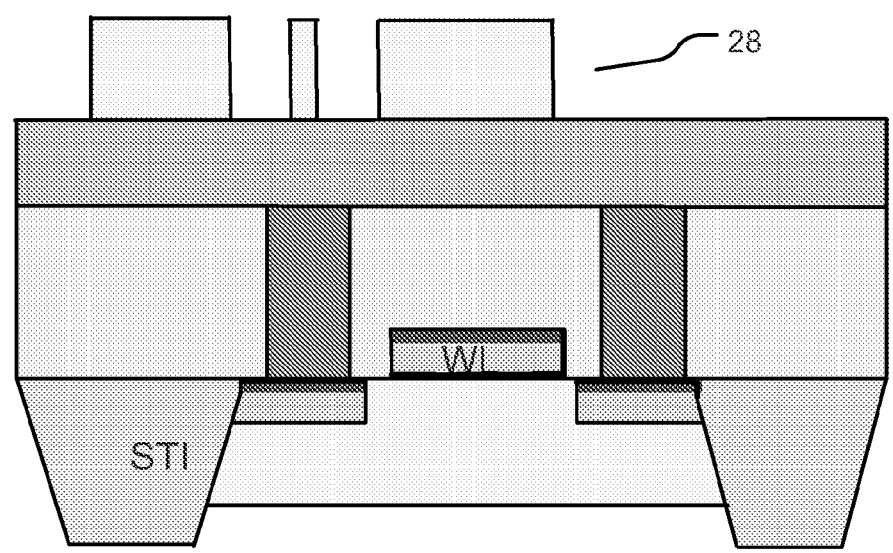

In FIG. 18, photolithographically patterned layer 28 is formed on the heater and interconnect material layer 26.

Figure 19:
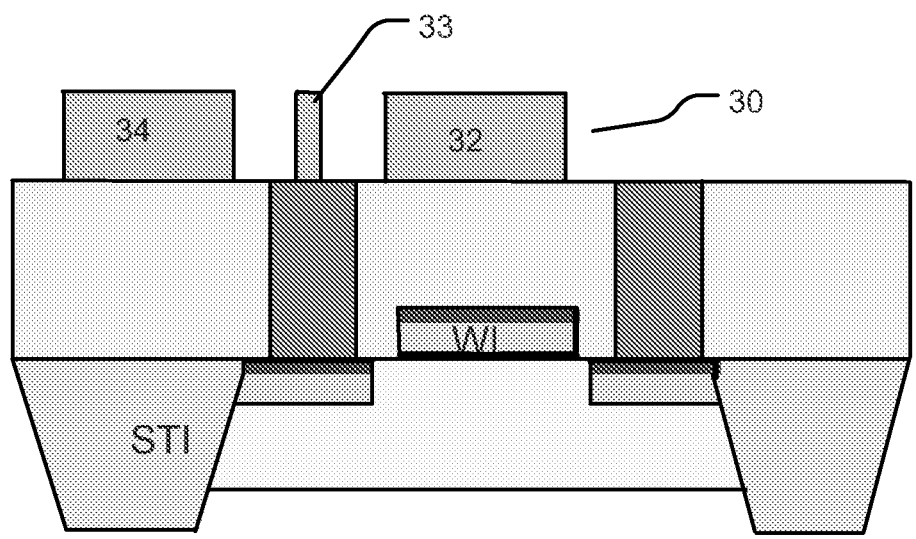

In FIG. 19, the photolithographically patterned mask layer 28 allows selective etching of the heater and interconnect material layer 26 areas unprotected by the photolithographically patterned layer 28. The remainder after etching is the heater 33 and interconnects 32 and 34. In some embodiments the heater 33 has an electrical resistivity greater than that of the material of the via 20. The material of the heater 33 may also, for example, comprise a material having a resistivity greater than that of the highest resistance state of the material of the memory element to be formed. In certain embodiments the heater 33 comprises doped semiconductor material. Interconnects 32 and 34 are the different interconnects leading to the logic blocks of a programmable logic device. Although, in this embodiment, the interconnects 32 and 34 are the same material as heater 33 for efficient manufacture, alternatively the interconnects 32 and 34 are different material as heater 33, at the cost of additional steps. In such an embodiment with different materials, interconnects 32 and 34 are any suitable conductive material.

Figure 20:
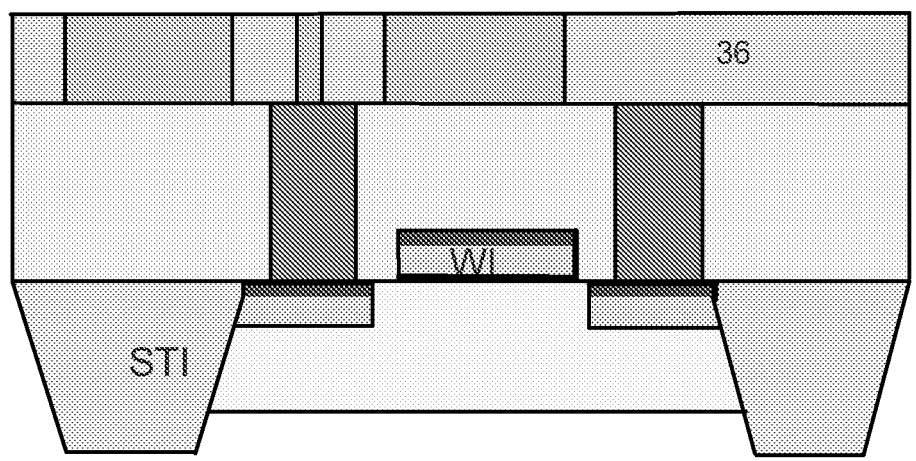

In FIG. 20, dielectric fill material 36 is deposited to surround the heater 33 and interconnects 32 and 34, with excess dielectric fill material removed by a planarization process such as Chemical Mechanical Polishing (CMP).

Figure 21:
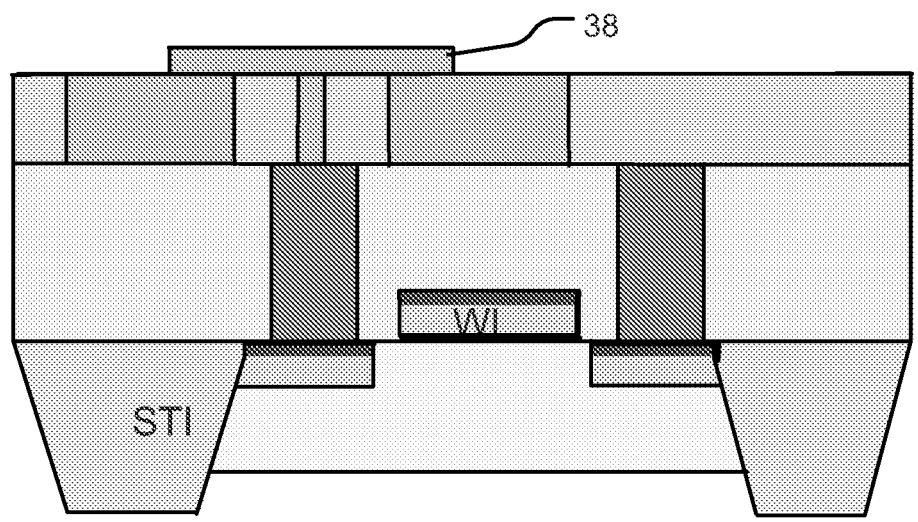

In FIG. 21, the phase change element 38 is formed on top of the structure, to connect with the heater 33 and interconnects 32 and 34. Forming a bridge phase change element 38 is discussed in U.S. Pat. No. 7,459,717 by Hsian-Lan Lung, incorporated herein by reference.

Figure 22:
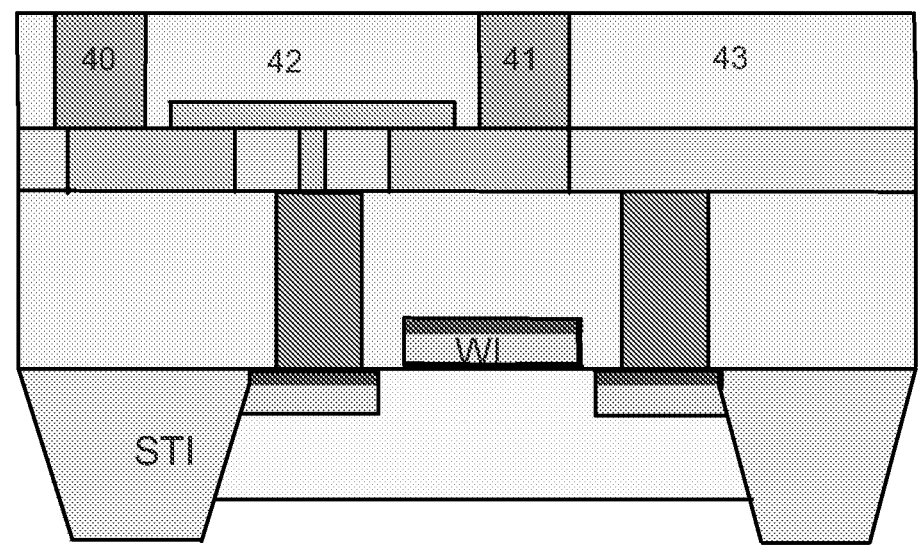

In FIG. 22, vias 40 and 41 are formed that connect with interconnects 32 and 34. Dielectric fill material 42 and 43 is deposited around the vias 40 and 41, with excess dielectric fill material removed by a planarization process such as Chemical Mechanical Polishing (CMP).

Figure 23:
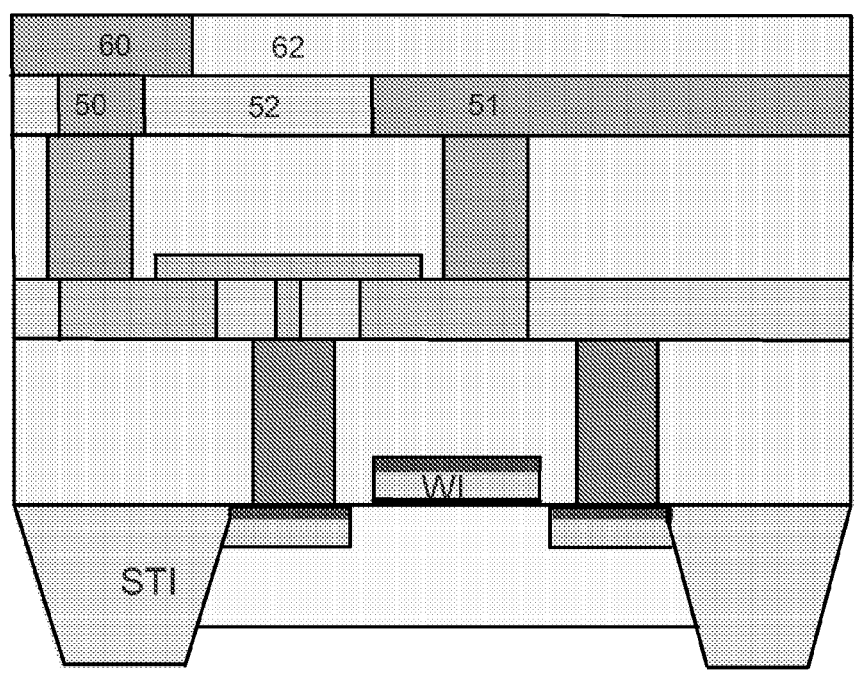

In FIG. 23, via 50 connecting to via 40, and interconnect 51 connecting to via 41 are formed. Dielectric fill material 52 is deposited between via 50 and interconnect 51, and the excess removed. Interconnect 60 is formed to connect to via 50. Dielectric fill material 62 is deposited next to via 50, and the excess removed. Interconnects 51 and 60 connect to the logic blocks of the programmable logic device Dielectric fill material 42 and 43 is deposited to surround the vias 40 and 41, with excess dielectric fill material removed by a planarization process such as Chemical Mechanical Polishing (CMP).

FIGS. 24-28 show top views of a process flow to make a phase change element as the configurable interconnection coupling interconnects 1 and 2 of the logic blocks, where the phase change element has an amorphous region through which the phase change element receives pulses from a programming circuit.

Figure 24:
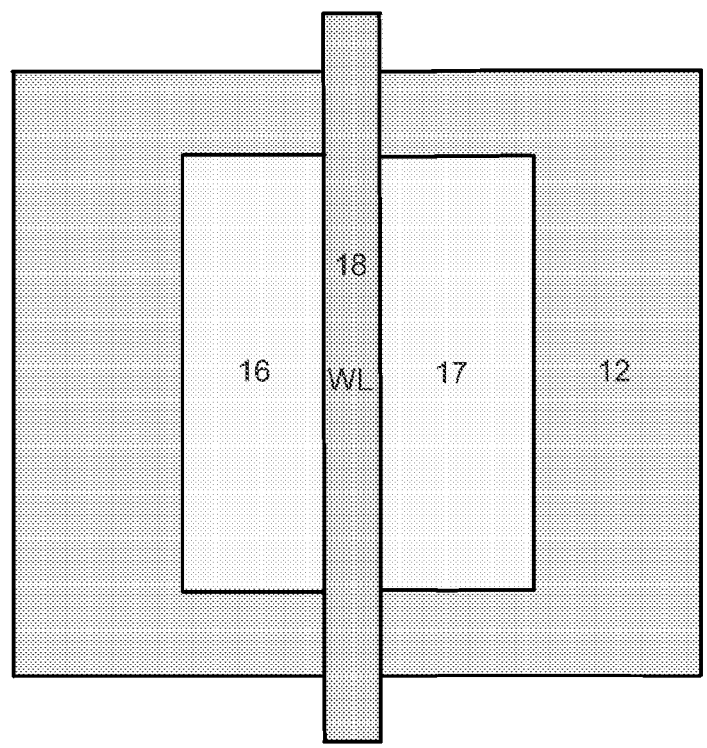
FIGS. 24-28 show top views of a process flow to make a phase change element as the configurable interconnection coupling interconnects 1 and 2 of the logic blocks, where the phase change element has an amorphous region through which the phase change element receives pulses from a programming circuit.

In FIG. 24, word line 18 is formed on an active region, separating source and drain regions 16 and 17. The word line 18 is part of the programming circuitry for the configurable interconnect. Source and drain regions 16 and 17 are in a substrate 12.

Figure 25:
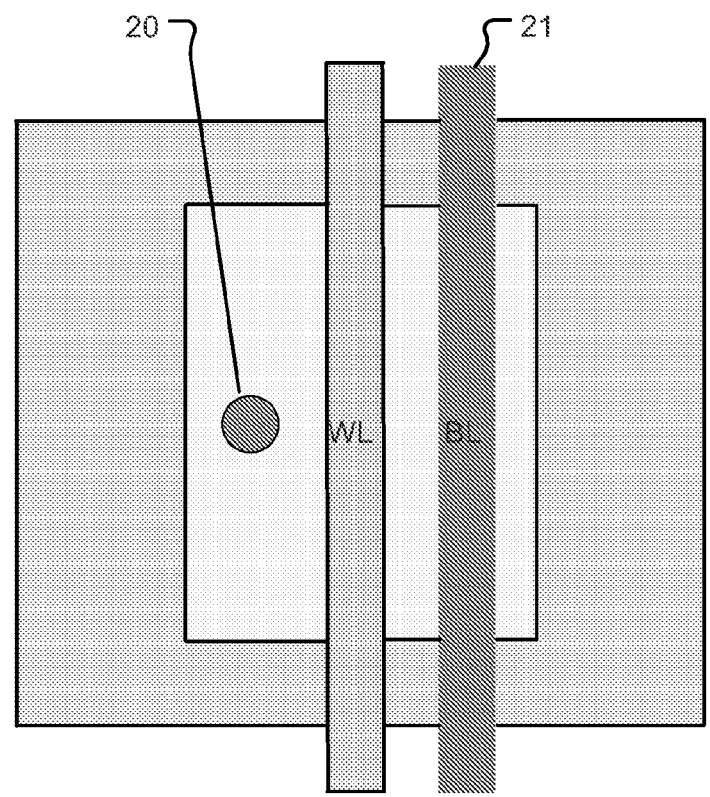

In FIG. 25, via 20 and a bit line 21 are formed on source and drain regions 16 and 17. The bit line 21 is part of the programming circuitry for the configurable interconnect.

Figure 26:
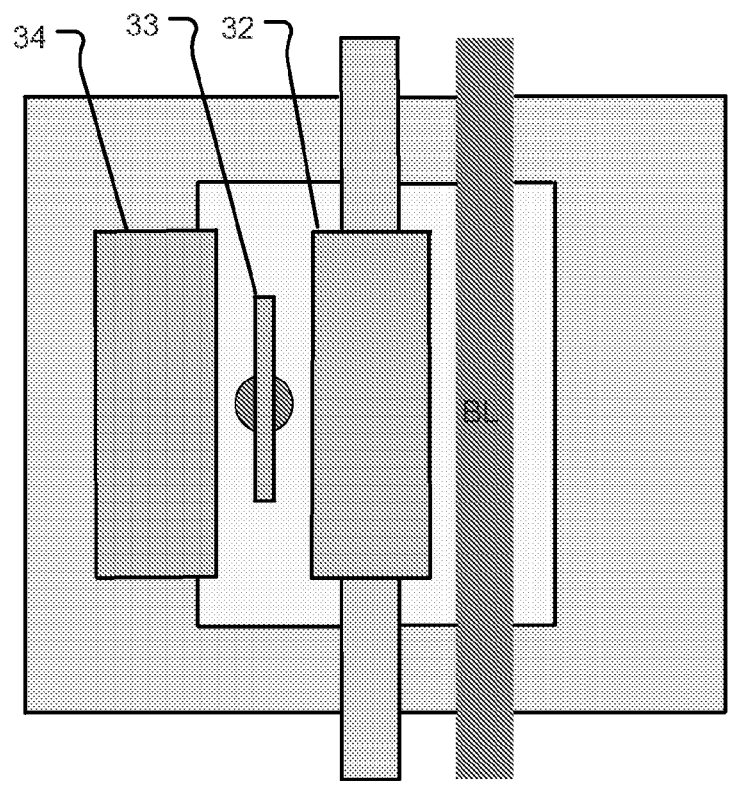

In FIG. 26, interconnects 32 and 34, and heater 33 are formed. Heater 33 connects with the via 20. Although interconnect 32 appears over word line 18, interconnect 32 and word line 18 are separated by intervening fill dielectric.

Figure 27:
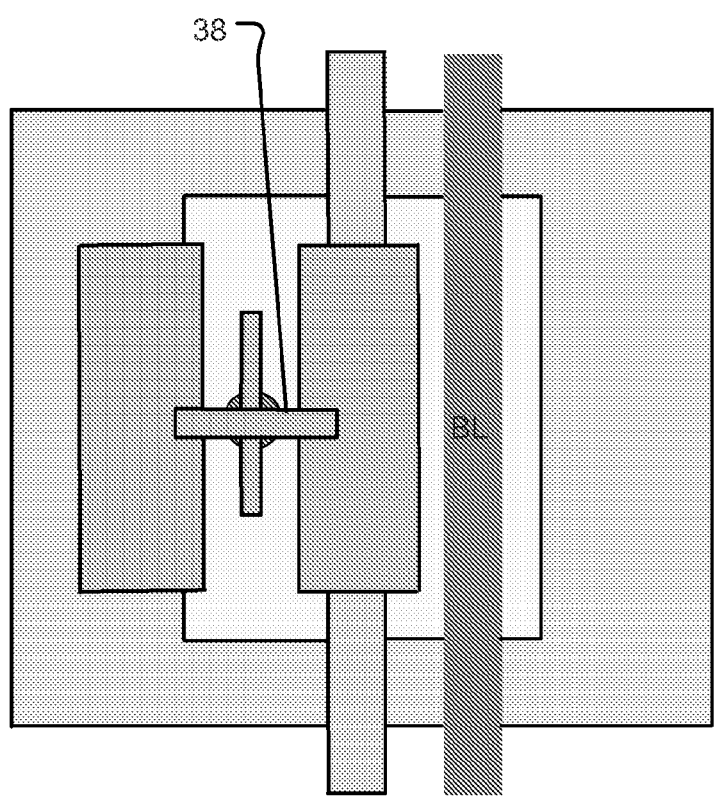

In FIG. 27, a phase change element 38 is formed on interconnects 32 and 34, and heater 33.

Figure 28:
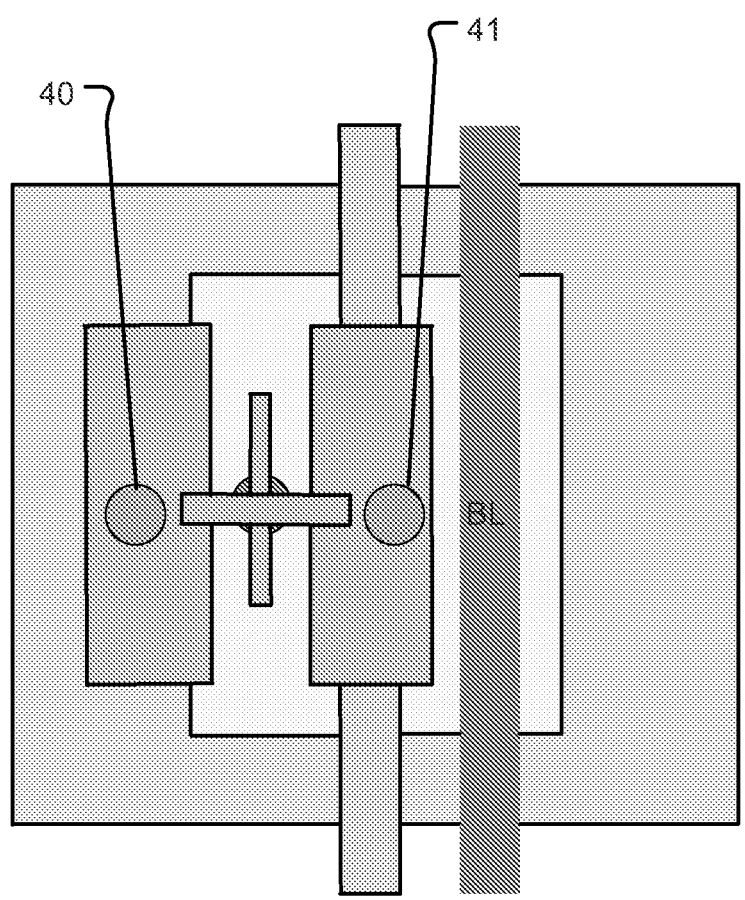

In FIG. 28, vias 40 and 41 are formed to connect to interconnects 32 and 34. Subsequently, interconnects to the logic blocks are formed, that lead to the logic blocks of the programmable logic device.

Figure 29:
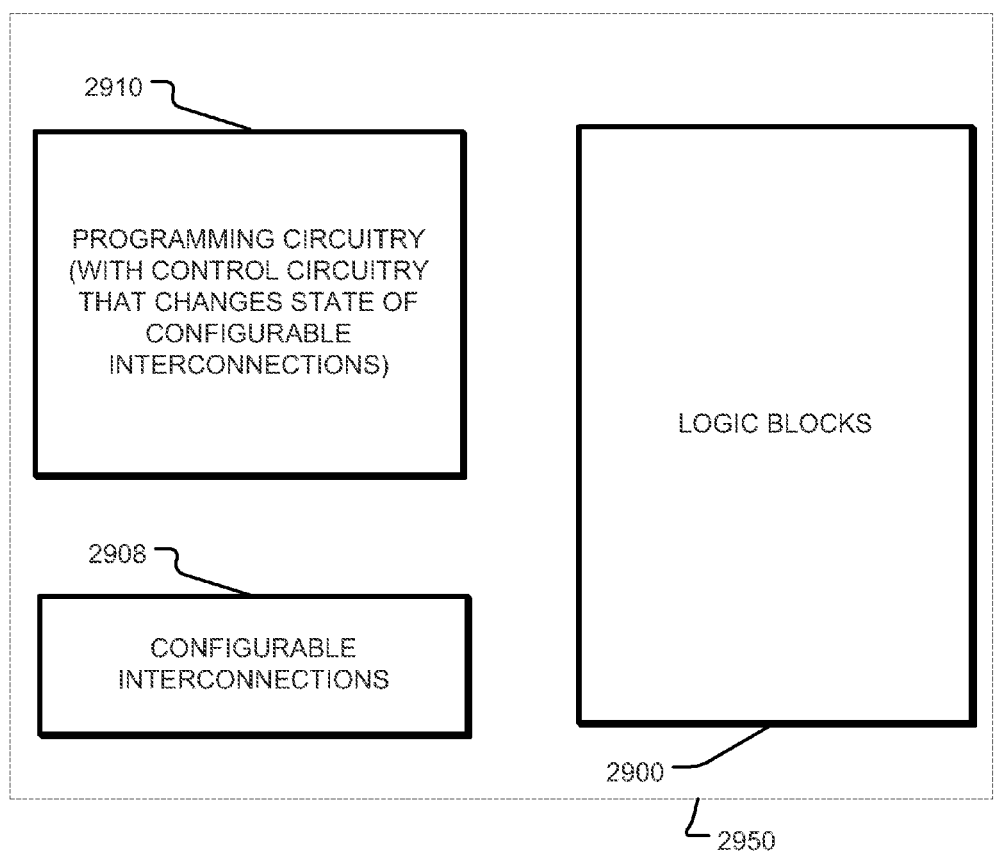
FIG. 29 is a functional block diagram of an example integrated circuit with the logic blocks, configurable interconnections coupling interconnects of the logic blocks, and programming circuitry of the configurable interconnections.

FIG. 29 is a functional block diagram of an example programmable logic device integrated circuit with the logic blocks, configurable interconnections coupling interconnects of the logic blocks, and programming circuitry of the configurable interconnections.

The programmable logic device integrated circuit 2950 has several functional blocks (shown separately for convenience, although each functional block is physically spread out around the integrated circuit and interconnected numerous times with the other functional blocks). Logic blocks 2900 are connected by the configurable interconnections 2908. The configurable interconnections 2908 are programmed by the programming circuitry 2910. The programming circuitry 2910 includes, in addition to programming bit lines and programming word lines, control circuitry that implements the change of state of the configurable interconnections 2908, by sending the various pulses through the programming bit line and the control signals through the programming word lines.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An apparatus, comprising:
a programmable logic device having logic blocks, configurable interconnections coupling interconnects of the logic blocks, and programming circuitry of the configurable interconnections, wherein the configurable interconnections include:
a plurality of phase change elements, each phase change element in the plurality coupling a first interconnect and a second interconnect of the logic blocks;
grounding transistors electrically coupled to the interconnects of the logic blocks, the grounding transistors electrically isolating the interconnects from the programming circuitry, wherein the grounding transistors are turned on by programming bit lines of the programming circuitry; wherein,
each phase change element in the plurality of phase change elements including:
an amorphous region connected to a heater to receive pulses from the programming circuitry via a path distinct from the first interconnect and the second interconnect, wherein the amorphous region electrically isolates the heater from the first interconnect and the second interconnect.

2. The apparatus of claim 1, wherein the amorphous region electrically isolates the first interconnect and the second interconnect from the programming circuitry.

3. The apparatus of claim 1, wherein each phase change element in the plurality of phase change elements has a plurality of electrical resistance states, including:
a first state of a first electrical resistance between the first interconnect and the second interconnect, responsive to the amorphous region having a first size;
a second state of second electrical resistance between the first interconnect and the second interconnect, the second electrical resistance higher than the first electrical resistance, responsive to the amorphous region having a second size larger than the first size.

4. The apparatus of claim 1, wherein the programming circuitry is configured to apply the pulses, including a first reset pulse and a second reset pulse of different electrical characteristics to result in a variable size of the amorphous region.

5. The apparatus of claim 1, wherein the programming circuitry is configured to apply the pulses, including a first reset pulse and a second reset pulse of different electrical characteristics but a same duration to result in a variable size of the amorphous region.

6. The apparatus of claim 1, wherein the programming circuitry is configured to apply the pulses, including a first reset pulse and a second reset pulse of different voltages to result in a variable size of the amorphous region.

7. The apparatus of claim 1, wherein the programming circuitry is configured to apply the pulses, including a first reset pulse and a second reset pulse of a same duration but different voltages to result in a variable size of the amorphous region.

8. The apparatus of claim 1, further comprising:
   the heater connected to the amorphous region and in the path receiving pulses from the programming circuitry.

\* \* \* \* \*